(12) United States Patent
Ho et al.

(10) Patent No.: US 12,437,936 B2
(45) Date of Patent: Oct. 7, 2025

(54) HALIDE PEROVSKITE, ITS FABRICATION AND USE THE SAME

(71) Applicant: City University of Hong Kong, Kowloon (HK)

(72) Inventors: Chung Yin Johnny Ho, New Territories (HK); Dengji Li, Kowloon (HK); You Meng, Kowloon (HK); Yini Zheng, Kowloon (HK)

(73) Assignee: City University of Hong Kong, Kowloon (HK)

( * ) Notice: Subject to any disclaimer, the term of this patent is extended or adjusted under 35 U.S.C. 154(b) by 456 days.

(21) Appl. No.: 18/065,242

(22) Filed: Dec. 13, 2022

(65) Prior Publication Data

US 2024/0194418 A1    Jun. 13, 2024

(51) Int. Cl.
| | |
|---|---|
| *H01G 9/20* | (2006.01) |
| *H01G 9/00* | (2006.01) |
| *H10K 30/30* | (2023.01) |
| *H10K 30/65* | (2023.01) |
| *H10K 30/81* | (2023.01) |
| *H10K 71/10* | (2023.01) |
| *H10K 85/30* | (2023.01) |

(52) U.S. Cl.
CPC ......... *H01G 9/2009* (2013.01); *H01G 9/0036* (2013.01); *H10K 30/30* (2023.02); *H10K 30/65* (2023.02); *H10K 30/81* (2023.02); *H10K 71/10* (2023.02); *H10K 85/30* (2023.02)

(58) Field of Classification Search
None
See application file for complete search history.

(56) References Cited

U.S. PATENT DOCUMENTS

2024/0170591 A1* 5/2024 Ho .......................... H10F 77/16

OTHER PUBLICATIONS

Kim, Seokhyoung; Cahoon, James F., Geometric Nanophotonics: Light Management in Single Nanowires through Morphology, Acc. Chem. Res. 2019, 52, 12, 3511-3520.
Li D, Meng Y, Zheng Y, et al. Surface Energy-Mediated Self-Catalyzed CsPbBr3 Nanowires for Phototransistors. Advanced Electronic Materials, 2022, 2200727.
M. Kulbak, S. Gupta, N. Kedem, I. Levine, T. Bendikov, G. Hodes, D. Cahen, J. Phys. Chem. Lett. 2016, 7, 167.
M. Kulbak, D. Cahen, G. Hodes, J. Phys. Chem. Lett. 2015, 6, 2452.
H. Zhu, Y. Fu, F. Meng, X. Wu, Z. Gong, Q. Ding, M. V. Gustafsson, M. T. Trinh, S. Jin, X. Y. Zhu, Nat. Mater. 2015, 14, 636.
L. N. Quan, R. Quintero-Bermudez, O. Voznyy, G. Walters, A. Jain, J. Z. Fan, X. Zheng, Z. Yang, E. H. Sargent, Adv. Mater. 2017, 29, 1605945.

(Continued)

*Primary Examiner* — Anthony Ho
(74) *Attorney, Agent, or Firm* — Renner, Kenner, Greive, Bobak, Taylor & Weber

(57) ABSTRACT

A method of fabricating a halide perovskite having a general formula of $ABX_3$, wherein A, B, and X are inorganic elements and X is a halide, the method including a vapor-liquid-solid process triggered by a catalyst formed from a halide precursor of inorganic element B. A $ABX_3$ nanowire formed by the method and a photoelectronic device with the $ABX_3$ nanowire.

36 Claims, 39 Drawing Sheets

(56) References Cited

OTHER PUBLICATIONS

J. Li, L. Xu, T. Wang, J. Song, J. Chen, J. Xue, Y. Dong, B. Cai, Q. Shan, B. Han, H. Zeng, Adv. Mater. 2017, 29, 1603885.
Q. Zhang, R. Su, W. Du, X. Liu, L. Zhao, S. T. Ha, Q. Xiong, Small Methods 2017, 1, 1700163.
D. Zhang, Y. Yang, Y. Bekenstein, Y. Yu, N. A. Gibson, A. B. Wong, S. W. Eaton, N. Kornienko, Q. Kong, M. Lai, A. P. Alivisatos, S. R. Leone, P. Yang, J. Am. Chem. Soc. 2016, 138, 7236.
Y. Bekenstein, B. A. Koscher, S. W. Eaton, P. Yang, A. P. Alivisatos, J. Am. Chem. Soc. 2015, 137, 16008.
D. Zhang, S. W. Eaton, Y. Yu, L. Dou, P. Yang, J. Am. Chem. Soc. 2015, 137, 9230.
G. Raino, M. A. Becker, M. I. Bodnarchuk, R. F. Mahrt, M. V. Kovalenko, T. Stoferle, Nature 2018, 563, 671.
K. Hu, H. Zhou, Z. Jiang, X. Wang, S. Yuan, J. Lan, Y. Fu, X. Zhang, W. Zheng, X. Wang, X. Zhu, L. Liao, G. Xu, S. Jin, A. Pan, ACS Nano 2017, 11, 9869.
K. Wang, H. Zhou, S. Yuan, W. Zheng, Y. Jiang, X. Zhuang, H. Liu, Q. Zhang, X. Zhu, X. Wang, A. Pan, Nano Res. 2017, 10, 3385.
Yang, X. Li, W. Zhou, S. Zhang, C. Meng, Y. Wu, Y. Wang, H. Zeng, Adv. Mater. 2019, 31, 1900767.
X. Li, Y. Meng, R. Fan, S. Fan, C. Dang, X. Feng, J. C. Ho, Y. Lu, Nano Res. 2021, 14, 4033.
M. A. Reyes-Martinez, A. L. Abdelhady, M. I. Saidaminov, D. Y. Chung, O. M. Bakr, M. G. Kanatzidis, W. O. Soboyejo, Y. L. Loo, Adv. Mater. 2017, 29, 1606556.
C. Zhao, Y. Liu, L. Chen, J. Li, H. Y. Fu, S. Zhao, W.-D. Li, G. Wei, ACS Appl. Electron. Mater. 2020, 3, 337.
Q. Shang, C. Li, S. Zhang, Y. Liang, Z. Liu, X. Liu, Q. Zhang, Nano Lett. 2020, 20, 1023.
K. Wang, Y. Wang, W. Gao, L. Song, C. Ran, Y. Chen, W. Huang, Adv. Mater. 2021, 33, 2003615.
K. Park, J. W. Lee, J. D. Kim, N. S. Han, D. M. Jang, S. Jeong, J. Park, J. K. Song, J. Phys. Chem. Lett. 2016, 7, 3703.
J. H. Im, J. Luo, M. Franckevicius, N. Pellet, P. Gao, T. Moehl, S. M. Zakeeruddin, M. K. Nazeeruddin, M. Gratzel, N. G. Park, Nano Lett. 2015, 15, 2120.
L. Gu, M. M. Tavakoli, D. Zhang, Q. Zhang, A. Waleed, Y. Xiao, K. H. Tsui, Y. Lin, L. Liao, J. Wang, Z. Fan, Adv. Mater. 2016, 28, 9713.
J. K. Meyers, S. Kim, D. J. Hill, E. E. M. Cating, L. J. Williams, A. S. Kumbhar, J. R. McBride, J. M. Papanikolas, J. F. Cahoon, Nano Lett. 2017, 17, 7561.
Q. Zhang, R. Su, X. Liu, J. Xing, T. C. Sum, Q. Xiong, Adv. Funct. Mater. 2016, 26, 6238.
K. Hu, X. Wang, P. Fan, Y. Li, X. Zhang, Q. Liu, W. Zheng, G. Xu, X. Wang, X. Zhu, A. Pan, Nano Lett. 2018, 18, 3024.
J. Chen, Y. Fu, L. Samad, L. Dang, Y. Zhao, S. Shen, L. Guo, S. Jin, Nano Lett. 2017, 17, 460.
M. Shoaib, X. Zhang, X. Wang, H. Zhou, T. Xu, X. Wang, X. Hu, H. Liu, X. Fan, W. Zheng, T. Yang, S. Yang, Q. Zhang, X. Zhu, L. Sun, A. Pan, J. Am. Chem. Soc. 2017, 139, 15592.
A. Waleed, M. M. Tavakoli, L. Gu, S. Hussain, D. Zhang, S. Poddar, Z. Wang, R. Zhang, Z. Fan, Nano Lett. 2017, 17, 4951.
C. Lan, R. Dong, Z. Zhou, L. Shu, D. Li, S. Yip, J. C. Ho, Adv. Mater. 2017, 29, 1702759.
Y. Meng, C. Lan, F. Li, S. Yip, R. Wei, X. Kang, X. Bu, R. Dong, H. Zhang, J. C. Ho, ACS Nano 2019, 13, 6060.
N. P. Dasgupta, J. Sun, C. Liu, S. Brittman, S. C. Andrews, J. Lim, H. Gao, R. Yan, P. Yang, Adv. Mater. 2014, 26, 2137.
J. Tersoff, Nano Lett. 2015, 15, 6609.
F. Panciera, Z. Baraissov, G. Patriarche, V. G. Dubrovskii, F. Glas, L. Travers, U. Mirsaidov, J. C. Harmand, Nano Lett. 2020, 20, 1669.
B. Mandl, J. Stangl, E. Hilner, A. A. Zakharov, K. Hillerich, A. W. Dey, L. Samuelson, G. Bauer, K. Deppert, A. Mikkelsen, Nano Lett. 2010, 10, 4443.
D. Rudolph, S. Hertenberger, S. Bolte, W. Paosangthong, D. Spirkoska, M. Doblinger, M. Bichler, J. J. Finley, G. Abstreiter, G. Koblmuller, Nano Lett. 2011, 11, 3848.

K. Yu, H. Wang, J. Lu, J. Zhao, J. Misuraca, P. Xiong, S. von Molnar, Nano Lett. 2012, 12, 5436.
H. Zhou, S. Yuan, X. Wang, T. Xu, X. Wang, H. Li, W. Zheng, P. Fan, Y. Li, L. Sun, A. Pan, ACS Nano 2017, 11, 1189.
G. Niu, H. Yu, J. Li, D. Wang, L. Wang, Nano Energy 2016, 27, 87.
H. Okamoto, J. Phase Equilib. Diffus. 2016, 37, 246.
A. W. Adamson, A. P. Gast, Physical Chemistry of Surfaces, Interscience Publishers, New York 1967, p. 15.
R. L. Smithson, D. J. McClure, D. F. Evans, Thin Solid Films 1997, 307, 110.
J. Baumgartner, A. Dey, P. H. Bomans, C. L. Coadou, P. Fratzl, N. A. Sommerdijk, D. Faivre, Nat. Mater. 2013, 12, 310.
P. Biswal, S. Stalin, A. Kludze, S. Choudhury, L. A. Archer, Nano Lett. 2019, 19, 8191.
Y. S. Zhao, P. Zhan, J. Kim, C. Sun, J. Huang, ACS Nano 2010, 4, 1630.
J. Xing, X. F. Liu, Q. Zhang, S. T. Ha, Y. W. Yuan, C. Shen, T. C. Sum, Q. Xiong, Nano Lett. 2015, 15, 4571.
H. Shim, N. Shin, J. Phys. Chem. Lett. 2019, 10, 6741.
B. A. Wacaser, K. A. Dick, J. Johansson, M. T. Borgstrom, K. Deppert, L. Samuelson, Adv. Mater. 2009, 21, 153.
Q. A. Akkerman, G. Raino, M. V. Kovalenko, L. Manna, Nat. Mater. 2018, 17, 394.
J. Dean, N. Lange, Lange's Handbook of Chemistry, 15th ed, McGraw-Hill, Inc, New York 1999.
C. Lan, C. Li, S. Wang, T. He, Z. Zhou, D. Wei, H. Guo, H. Yang, Y. Liu, J. Mater. Chem. C 2017, 5, 1494.
C. Lan, Z. Zhou, Z. Zhou, C. Li, L. Shu, L. Shen, D. Li, R. Dong, S. Yip, J. C. Ho, Nano Res. 2018, 11, 3371.
O. Lopez-Sanchez, D. Lembke, M. Kayci, A. Radenovic, A. Kis, Nat. Nanotechnol. 2013, 8, 497.
Y. Yin, Y. Guo, D. Liu, C. Miao, F. Liu, X. Zhuang, Y. Tan, F. Chen, Z. X. Yang, Adv. Opt. Mater. 2022, 10, 2102291.
J. Feng, X. Yan, Y. Liu, H. Gao, Y. Wu, B. Su, L. Jiang, Adv. Mater. 2017, 29, 1605993.
W. Zhai, J. Lin, C. Li, S. Hu, Y. Huang, C. Yu, Z. Wen, Z. Liu, Y. Fang, C. Tang, Nanoscale 2018, 10, 21451.
H. Zhou, Z. Song, C. R. Grice, C. Chen, J. Zhang, Y. Zhu, R. Liu, H. Wang, Y. Yan, Nano Energy 2018, 53, 880.
E. Oksenberg, E. Sanders, R. Popovitz-Biro, L. Houben, E. Joselevich, Nano Lett. 2018, 18, 424.
M. Sun, Q. Fang, Z. Zhang, D. Xie, Y. Sun, J. Xu, W. Li, T. Ren, Y. Zhang, ACS Appl. Mater. Interfaces 2018, 10, 7231.
P. Gui, Z. Chen, B. Li, F. Yao, X. Zheng, Q. Lin, G. Fang, ACS Photonics 2018, 5, 2113.
X. Mo, X. Li, G. Dai, P. He, J. Sun, H. Huang, J. Yang, Nanoscale 2019, 11, 21386.
G. Tong, M. Jiang, D.-Y. Son, L. Qiu, Z. Liu, L. K. Ono, Y. Qi, ACS Appl. Mater. Interfaces 2020, 12, 14185.
G. Tong, M. Jiang, D. Y. Son, L. K. Ono, Y. Qi, Adv. Funct. Mater. 2020, 30, 2002526.
S. Pan, H. Zou, A. C. Wang, Z. Wang, J. Yu, C. Lan, Q. Liu, Z. L. Wang, T. Lian, J. Peng, Angew. Chem. Int. Ed. 2020, 59, 14942.
F. Winterer, L. S. Walter, J. Lenz, S. Seebauer, Y. Tong, L. Polavarapu, R. T. Weitz, Adv. Electron. Mater. 2021, 7, 2100105.
M. Yu, D. Zhang, Y. Xu, J. Lin, C. Yu, Y. Fang, Z. Liu, Z. Guo, C. Tang, Y. Huang, J. Colloid Interface Sci. 2022, 608, 2367.
Y. Zhou, J. Luo, Y. Zhao, C. Ge, C. Wang, L. Gao, C. Zhang, M. Hu, G. Niu, J. Tang, Adv. Opt. Mater. 2018, 6, 1800679.
T. Yang, Y. Zheng, Z. Du, W. Liu, Z. Yang, F. Gao, L. Wang, K.-C. Chou, X. Hou, W. Yang, ACS Nano 2018, 12, 1611.
G. Chen, J. Feng, H. Gao, Y. Zhao, Y. Pi, X. Jiang, Y. Wu, L. Jiang, Adv. Funct. Mater. 2019, 29, 1808741.
X. Wu, J. Sun, H. Shao, Y. Zhai, L. Li, W. Chen, J. Zhu, B. Dong, L. Xu, D. Zhou, Chem. Eng. J. 2021, 426, 131310.
M. Wang, W. Tian, F. Cao, M. Wang, L. Li, Adv. Funct. Mater. 2020, 30, 1909771.
B. Pradhan, G. S. Kumar, S. Sain, A. Dalui, U. K. Ghorai, S. K. Pradhan, S. Acharya, Chem. Mater. 2018, 30, 2135.
M. Han, J. Sun, M. Peng, N. Han, Z. Chen, D. Liu, Y. Guo, S. Zhao, C. Shan, T. Xu, J. Phys. Chem. C 2019, 123, 17566.
X. Tang, H. Zhou, X. Pan, R. Liu, D. Wu, H. Wang, ACS Appl. Mater. Interfaces 2020, 12, 4843.

(56) References Cited

OTHER PUBLICATIONS

E. Horvath, M. Spina, Z. Szekrenyes, K. Kamaras, R. Gaal, D. Gachet, L. Forro, Nano Lett. 2014, 14, 6761.
H. Deng, X. Yang, D. Dong, B. Li, D. Yang, S. Yuan, K. Qiao, Y.-B. Cheng, J. Tang, H. Song, Nano Lett. 2015, 15, 7963.
H. Deng, D. Dong, K. Qiao, L. Bu, B. Li, D. Yang, H.-E. Wang, Y. Cheng, Z. Zhao, J. Tang, Nanoscale 2015, 7, 4163.
W. Deng, X. Zhang, L. Huang, X. Xu, L. Wang, J. Wang, Q. Shang, S. T. Lee, J. Jie, Adv. Mater. 2016, 28, 2201.
L. Gao, K. Zeng, J. Guo, C. Ge, J. Du, Y. Zhao, C. Chen, H. Deng, Y. He, H. Song, Nano Lett. 2016, 16, 7446.
Q. Zhou, J. G. Park, R. Nie, A. K. Thokchom, D. Ha, J. Pan, S. I. Seok, T. Kim, ACS Nano 2018, 12, 8406.
C. Y. Wu, W. Peng, T. Fang, B. Wang, C. Xie, L. Wang, W. H. Yang, L. B. Luo, Adv. Electron. Mater. 2019, 5, 1900135.
F. Cao, W. Tian, M. Wang, H. Cao, L. Li, Adv. Funct. Mater. 2019, 29, 1901280.
C. Y. Chang, K. S. Wu, C. Y. Chang, Adv. Funct. Mater. 2021, 2108356.
R. Huang, D.-H. Lin, J.-Y. Liu, C.-Y. Wu, D. Wu, L.-B. Luo, Sci. China Mater. 2021, 64, 2497.
W. Ren, Q. Tan, Q. Wang, Y. Liu, Chem. Eng. J. 2021, 406, 126779.
S. X. Li, Y. S. Xu, C. L. Li, Q. Guo, G. Wang, H. Xia, H. H. Fang, L. Shen, H. B. Sun, Adv. Mater. 2020, 32, 2001998.
A. Waleed, M. M. Tavakoli, L. Gu, Z. Wang, D. Zhang, A. Manikandan, Q. Zhang, R. Zhang, Y.-L. Chueh, Z. Fan, Nano Lett. 2017, 17, 523.
I. M. Asuo, P. Fourmont, I. Ka, D. Gedamu, S. Bouzidi, A. Pignolet, R. Nechache, S. G. Cloutier, Small 2019, 15, 1804150.
Gu, D. Zhang, M. Kam, Q. Zhang, S. Poddar, Y. Fu, X. Mo, Z. Fan, Nanoscale 2018, 10, 15164.
Y. Zhao, Y. Qiu, J. Feng, J. Zhao, G. Chen, H. Gao, Y. Zhao, L. Jiang, Y. Wu, J. Am. Chem. Soc. 2021, 143, 8437.

\* cited by examiner

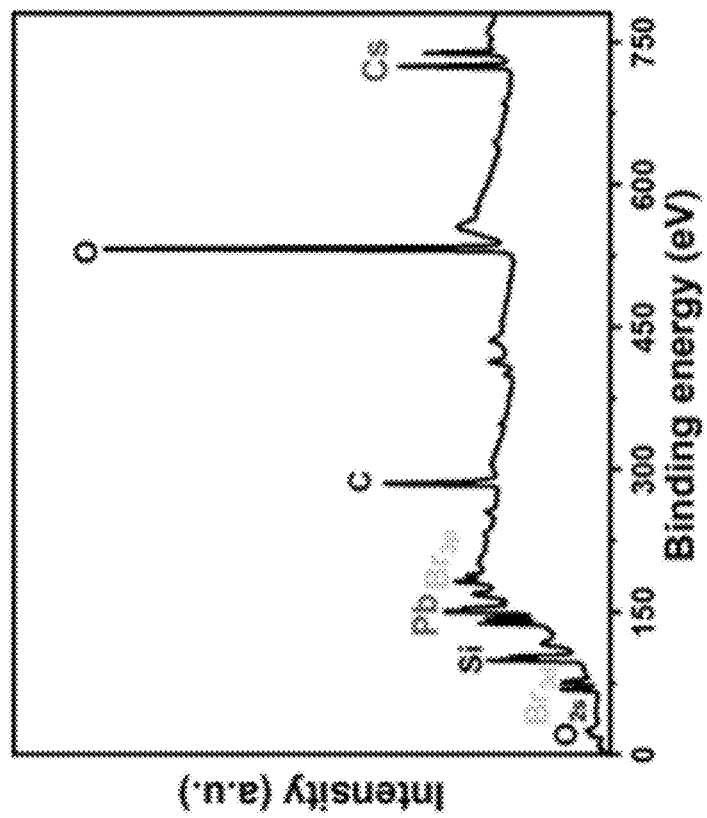
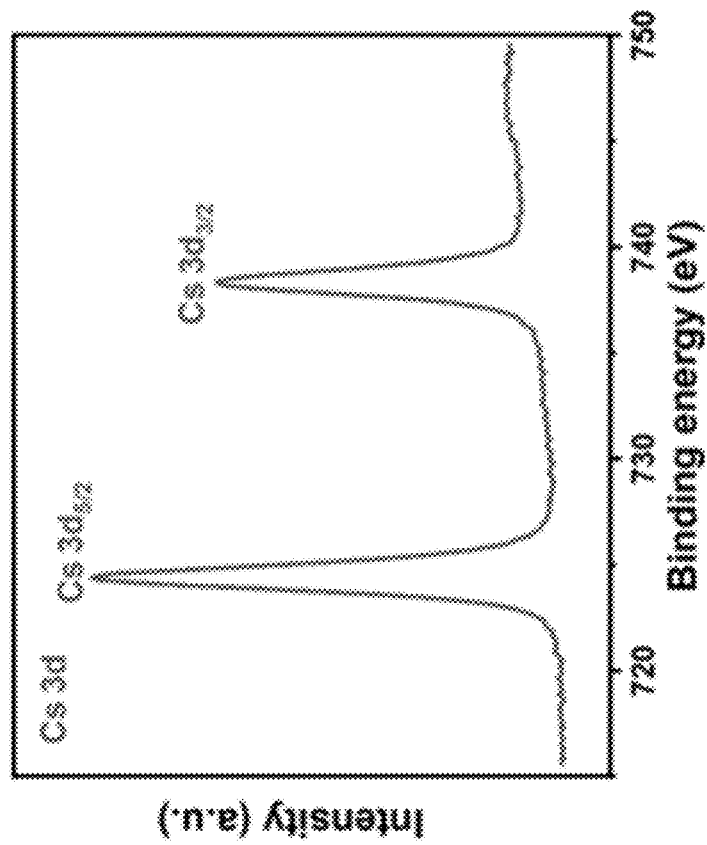
Fig. 8A
Fig. 8B

| Materials | Channel | Routes | R (A/W) | D* (×10¹²Jones) | Rise time (ms) | Decay time (ms) | On/off ratio |
|---|---|---|---|---|---|---|---|
| CsPbBr₃ | MWs | Vapor | 0.001 | - | 0.1 | 0.1 | >10³ |
| CsPbBr₃ | NWs | Solution | 1377 | - | 0.022 | 0.023 | 10³ |
| CsPbBr₃ | NWs | Vapor | 4400 | - | 0.252 | 0.3 | - |
| CsPbBr3 | NWs | Solvothermal | - | - | 82 | 54 | 1.1×10³ |
| CsPbBr₃/PMMA | NWs | Solution | 0.3 | 10 | 0.4 | 0.43 | 10⁶ |
| CsPbBr3 | NWs | Vapor | - | - | 0.01 | 0.005 | 10⁵ |
| CsPbBr₃/InGaZnO | NWs | Vapor | 3.794 | - | 2 | 96 | 1.2×10⁴ |
| CsPbBr₃ | MWs | Solution | 118 | >1 | <40 | <40 | >100 |
| CsPbBr₃ | single NW | Vapor | 312.2 | 15 | 55 | 10 | 3.57×10³ |
| CsPbBr₃ | single NW | VLS | 3306 | 6.0 | <50 | <50 | >10³ |
| CsPbBr₃ | NWs | Vapor | 6.44 | 2.88 | 301 | 242 | >10 |
| CsPbBr₃ | NWs array | Vapor | 7.66 | 4.05 | 275 | 550 | ~10⁵ |
| CsPbBr₃ | NWs array | Solution printing | 5.49 | - | 95 | 40 | >10³ |
| CsPbBr₃ | NWs | Solution | 25 | ~10 | - | - | 10⁴ |
| C8/CsPbBr₃ | NWs | Solvothermal | 2.36×10⁻² | 6.17 | 3 | 2.8 | 2.857×10³ |
| CsPbI₃ | NWs | Vapor | 6.7×10⁻⁵ | 1.57×10⁻⁴ | 292 | 234 | <10 |
| CsPbI₃ | NWs | Solution | 0.745 | 0.0346 | - | - | 2.68 |
| CsPbI₃ | Single NW | Vapor | 2920 | 51.7 | 0.05 | 0.15 | 10³ |
| CsPbI₃ | NWs | Solution | 1294 | 260 | 0.85 | 0.78 | >100 |
| CsPbCl₃ | single NW | VLS | 1183 | 6.6 | <50 | <50 | >10⁴ |
| CsPbCl₃/Eu(AcIO)₃ | NWs | Solution | 0.398 | 0.33 | 24 | 25 | 2×10⁵ |
| CsPbBr₃₋ₓIₓ | NWs array | Solution | 0.125 | - | 0.7 | 0.8 | 1000 |
| Cs₃Sb₂Cl₉ | NWs | Solution | 3616 | 1.2×10⁻⁶ | 130 | 230 | 10 |
| CsSnI₃ | NWs array | Vapor | 54 | 3.85×10⁻⁷ | 83.8 | 243.4 | 1.08 |
| CsPbₓSn₁₋ₓBr₃ | NWs | Solution | 0.011 | 0.02 | 4.25 | 4.82 | 80 |
| CsPbBr₃ | Single | Vapor | 2006 | 2.57 | 0.362 | 0.38 | 2.8×10⁴ |

Fig. 21B

| Materials | Channel | Routes | R (A/W) | D* ($\times 10^{12}$ Jones) | Rise time (ms) | Decay time (ms) | On/off ratio |
|---|---|---|---|---|---|---|---|
| MAPbI$_3$ | NWs | Solution | $5 \times 10^{-3}$ | - | 0.35 | 0.25 | 100 |
| MAPbI$_3$ | NWs | Solution | 0.1 | 1.02 | 0.3 | 0.4 | 300 |
| MAPbI$_3$ | NWs | Solution | 1.32 | 2.5 | 0.2 | 0.3 | 20 |
| MAPbI$_3$ | MWs Array | Solution | 13.57 | 5.25 | 0.08 | 0.24 | >100 |
| MAPbI$_3$ | NWs | Solution | 4.95 | 20 | <0.1 | <0.1 | $4 \times 10^3$ |
| MAPbI$_3$ | NWs array | Solution | 410 | 9.1 | 0.22 | 0.79 | >100 |
| MAPbI$_3$ | NWs | Solution | 0.16 | 1.3 | 0.0138 | 0.0161 | $3.3 \times 10^4$ |
| MAPbI$_3$/P(VDF-TrFE) | NWs Arrays | Solution imprinting | 0.012 | 7.3 | 0.088 | 0.154 | $>10^4$ |
| MAPbI$_3$ | NWs | Solution | 0.5 | 100 | $2.7 \times 10^{-4}$ | $2.1 \times 10^{-4}$ | $2.7 \times 10^3$ |
| MAPbI$_3$ | NWs Arrays | Solution | 20.56 | 4.73 | - | - | $1.2 \times 10^3$ |
| MAPbI$_3$/CdSe | MWs Arrays | Solution | 69.11 | 8.6 | 0.81 | 0.77 | $2.152 \times 10^3$ |
| MAPbBr$_3$ | MWs Array | Solution | 20 | 0.41 | 1.6 | 6.4 | $>10^3$ |
| MASnI$_3$ | NWs | Vapor | 0.47 | 0.088 | 1500 | 400 | ~5 |
| MAPbI$_{3-x}$(SCN)$_x$ | NWs | Solution | 0.62 | 7.3 | 0.227 | 0.215 | 100 |
| FAPbI$_3$ | NWs | Vapor | 0.0018-0.0047 | 0.2-0.5 | 8.5 | 9.5 | ~2 |
| (R-/S-α-PEA)$_2$PbI$_4$ | NWs Arrays | Solution | 47.1 | 12.4 | 0.267 | 0.258 | $>10^4$ |
| CsPbBr$_3$ | Single NW | Vapor | 2006 | 2.57 | 0.362 | 0.38 | $2.8 \times 10^4$ |

Fig. 21C

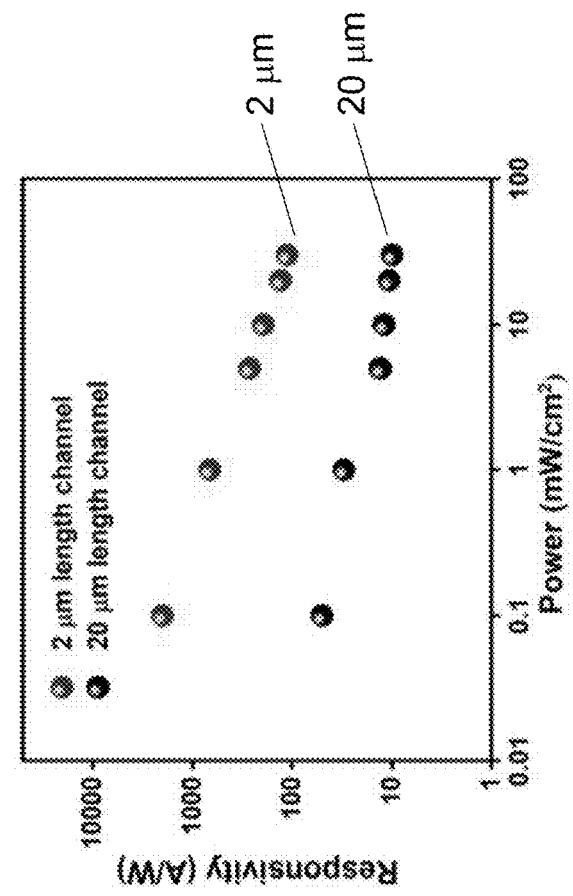
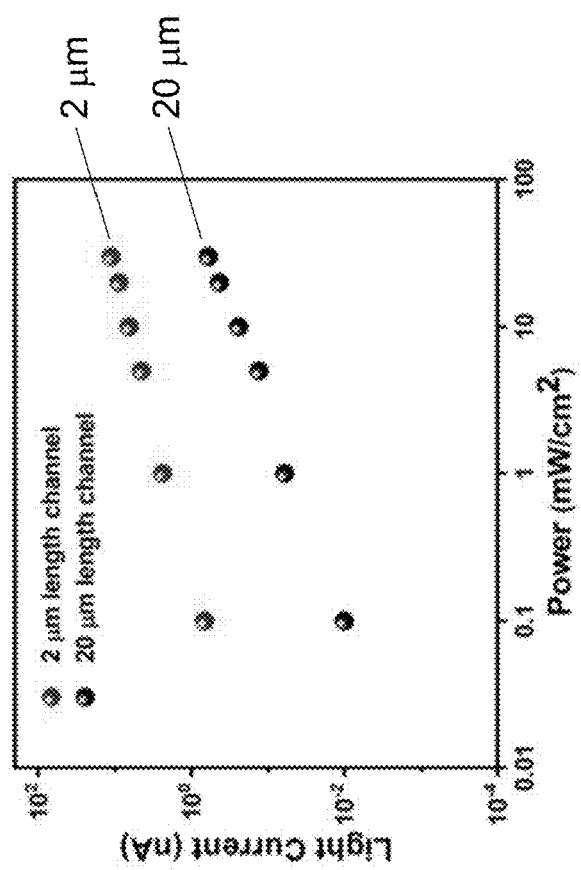
Fig. 26B
Fig. 26A

HALIDE PEROVSKITE, ITS FABRICATION AND USE THE SAME

FIELD OF THE INVENTION

The present invention relates to a method of fabricating a halide perovskite, in particular but not exclusive to an autocatalytic method. The present invention also relates to a halide perovskite nanowire and a photoelectronic device with halide perovskite nanowire.

BACKGROUND

Halide perovskites, in particular, lead halide perovskites ($CsPbX_3$) have been believed to be a promising candidate for next generation electronics and optoelectronics owing to their strong light absorption, long carrier lifetime, tunable bandgap and robust stability. It has been reported that $CsPbX_3$ perovskites have been fabricated in various nanoscale morphologies, such as nanocrystals, nanoplates, nano/microrods, nanowires (NWs), and quantum dots. Among them, 1D $CsPbX_3$ NWs have been attracted much attention as they are believed to provide unique charge transport pathways along the axial direction together with many intriguing characteristics such as good elasticity, flexibility, ductility, transparency, polarization sensitivity, etc.

Various vapor-phase methods have been reported for synthesizing $CsPbX_3$ NWs. In particular, it has been reported that $CsPbX_3$ NWs may be vertically grown on substrates with the assistance of Tin (Sn) particle catalysts through vapor-liquid-solid (VLS) mechanism. Although such mechanism is considered to be somewhat a convenient method, it is noteworthy that the Sn catalysts would inevitably introduce impurity atoms to $CsPbX_3$ NWs and thus altering their intrinsic material properties as well as stability.

Thus, there remains a strong need in developing a synthetic method for $CsPbX_3$ NWs that addresses or overcomes at least some of the aforementioned challenges.

SUMMARY OF THE INVENTION

In a first aspect of the present invention, there is provided a method of fabricating a halide perovskite having a general formula of $ABX_3$, wherein A, B, and X are inorganic elements and X is a halide, the method comprising a vapor-liquid-solid process triggered by a catalyst formed from a halide precursor of inorganic element B.

In an embodiment, A is Cs and B is selected from Pb, Sn, In, or Tl. Preferably, A is Cs and B is Pb.

It is preferred that the vapor-liquid-solid process is enabled by a one-step autocatalytic nucleation process.

In an embodiment, the catalyst is formed from a vapor-source Pb source and the catalyst is in the form of a Pb liquid droplet. Preferably, the catalyst is transformed into a $PbX_2$ alloying catalyst.

In an embodiment, the method further comprises the step of preparing the catalyst by depositing the vapor-source Pb source onto a roughened growth substrate.

It is preferred that the roughened growth substrate is a roughened $SiO_2$/Si growth substrate with a root-mean-square roughness of about 85 nm.

In an embodiment, the method further comprises the step of preparing the roughened growth substrate with an abrasive of about 400 mesh to about 1200 mesh.

In an embodiment, the method further comprises the steps of mixing the halide precursors $PbX_2$ and CsX with a molar ratio of about 2:1 and heating the halide precursor mixture in a first heating zone to serve as a vapor-phase Cs, Pb, and X source.

In an embodiment, the method further comprises the step of annealing the halide precursor mixture to suppress evaporation process of the mixture prior heating in the first heating zone.

In an embodiment, the heating temperature of the first heating zone is about 400° C. to about 500° C. Preferably, the heating temperature of the first heating zone is about 480° C.

In an embodiment, the method further comprises the steps of placing the roughened growth substrate into a second heating zone, and heating the roughened growth substrate at a growth temperature of about 250° C. to about 350° C. to allow the vapor-source Pb source to deposit on the roughened growth substrate to form the Pb liquid droplet, and convert to the $PbX_2$ alloying catalyst for further reacting with the vapor-phase Cs, Pb and X source. Preferably, X is selected from Cl, Br and I. The step preferably takes about 70 mins for the growth of $CsPbX_3$ nanowire on the roughened growth substrate.

It is preferred that the second heating zone has a growth temperature of about 330° C. It is further preferred that the second heating zone has a growth pressure of about 1.5 Torr. It is still further preferred that the second heating zone includes a carrier gas flow comprises Ar at about 100 sccm.

In an embodiment, the roughened growth substrate is placed in the second heating zone at a distance of about 10 cm to about 20 cm away from the halide precursor mixture. Preferably, the roughened growth substrate is placed in the second heating zone at a distance of about 15 cm away from the halide precursor mixture.

In an embodiment, the $CsPbX_3$ nanowire grows along a crystal plane with a lower surface free energy than other crystal planes, via a supersaturation process. Preferably, the $CsPbX_3$ nanowire grows along the (100) plane of the $CsPbX_3$ nanowire.

In an embodiment, the $CsPbX_3$ nanowire is selected from a group comprising $CsPbI_3$, $CsPbCl_3$, and $CsPbBr_3$ nanowires.

The present invention of the second aspect provides a $ABX_3$ nanowire formed by the method in accordance with the first aspect, wherein the $ABX_3$ nanowire is vertically formed on a roughened growth substrate, where A is Cs, B is Pb and X is a halide. Preferably, X is selected from Cl, Br and I.

In an embodiment, the $ABX_3$ nanowire is terminated with a spherical catalytic tip. Preferably, the spherical catalytic tip comprises a Pb—Br seed, which comprises a $PbBr_2$ alloying catalyst.

In an embodiment, when B is Pb and X is Br, resulting $CsPbBr_3$ nanowire comprises a monoclinic crystalline phase.

Preferably, the $CsPbBr_3$ nanowire is about 5 µm to about 15 µm in length and about 110 nm to about 120 nm in diameter, and emits green light across its entire length.

In the third aspect of the present invention, there is provided a photoelectronic device comprising the $ABX_3$ nanowire in accordance with the second aspect of the present invention.

In an embodiment, the photoelectronic device comprises a visible light photodetector and a phototransistor.

In an embodiment, when the photoelectronic device is the visible light photodetector, the $ABX_3$ nanowire is dry transferred onto a Au electrode. Preferably, the Au electrode is fabricated with a 2 μm channel length and is fabricated on a SiO$_2$/Si substrate.

In an embodiment, when the ABX$_3$ nanowire is a CsPbX$_3$ nanowire, the visible light photodetector has a dark current of about 100 fA or below. The photodetector also has a light current of about 10 nA with an incident light intensity of about 0.1 mW cm$^{-2}$, a specific detectivity of about 2.57× 10$^{12}$ Jones, a responsivity of about 2006 A W$^{-1}$ with an incident light intensity of about 0.1 mW cm$^{-2}$, and a photoresponse time from about 362 μs to about 380 μs.

In an embodiment, when the photoelectronic device is a phototransistor, it is preferred that the phototransistor comprises a bottom-gate top contact structure. Preferably, the ABX$_3$ nanowire is dry transferred onto a SiO$_2$/Si substrate, and a Au electrode is fabricated with a 20 μm channel length and is fabricated onto the SiO$_2$/Si substrate.

In an embodiment, when the ABX$_3$ is a CsPbX$_3$ nanowire, the phototransistor has a field-effect hole mobility of about 0.05 cm$^2$ V$^{-1}$ s$^{-1}$.

BRIEF DESCRIPTION OF THE DRAWINGS

FIG. 8A is a XPS spectrum of the self-catalyzed CsPbBr$_3$ NWs.

FIG. 8B is an enlarged XPS spectrum of FIG. 8A showing the Cs 3d peaks.

FIG. 21B is a table summarizing the photoelectronic performance of photodetectors based on the one-dimensional all-inorganic halide perovskites. NWs=Nanowires; MWs=Microwires; VLS=Vapor-liquid-Solid.

FIG. 21C is a table summarizing the photoelectronic performance of photodetectors based on the one-dimensional inorganic-organic hybrid halide perovskites. NWs=Nanowires; MWs=Microwires; VLS=Vapor-liquid-Solid.

FIG. 26A is a plot of light current against power showing the light current comparison of the top-contact (20 µm channel length) and bottom-contact (2 µm channel length) phototransistors.

FIG. 26B is a plot of responsivity against power showing the responsivity comparison of the top-contact (20 µm channel length) and bottom-contact (2 µm channel length) phototransistors.

DESCRIPTION OF THE PREFERRED EMBODIMENTS

Figure 1:
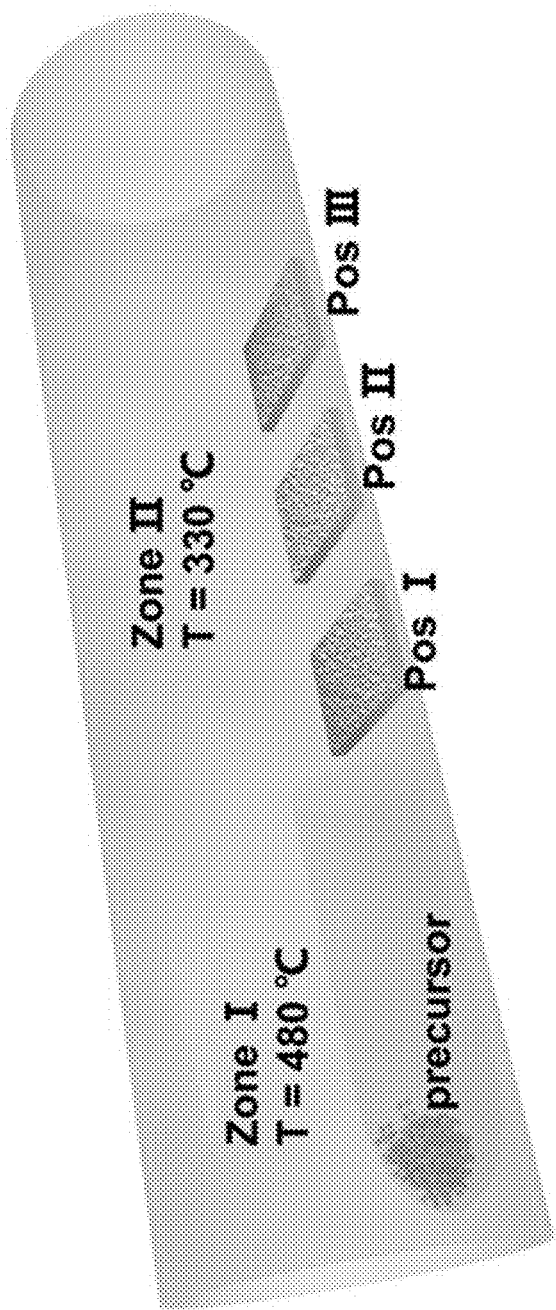
FIG. 1 is a schematic diagram illustrating the chemical vapor deposition (CVD) system for self-catalyzed CsPbBr$_3$ nanowires (NWs) growth in accordance with an embodiment of the present invention. Pos I, Pos II, and Pos III are respectively about 15 cm, about 16 cm, and about 17 cm away from the precursor.

Unless otherwise specifically provided, all tests herein are conducted at standard conditions which include a room and testing temperature of 25° C., sea level (1 atm.) pressure, pH 7, and all measurements are made in metric units. Furthermore, all percentages, ratios, etc. herein are by weight, unless specifically indicated otherwise. It is understood that unless otherwise specifically noted, the materials compounds, chemicals, etc. described herein are typically commodity items and/or industry-standard items available from a variety of suppliers worldwide.

Unless otherwise defined, all technical terms used herein have the same meaning as commonly understood by one skilled in the art to which the invention belongs.

As used herein, the forms "a", "an", and "the" are intended to include the singular and plural forms unless the context clearly indicates otherwise.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

In typical vapor-liquid-solid (VLS) growth process for 1D nanostructures such as nanowires (NWs) from chemical vapor deposition (CVD), it involves the following three steps: 1) eutectic alloy droplets formation, 2) NW nucleation, and 3) growth of NWs. In particular, it is believed that such VLS NW growth relies on the liquid (eutectic) alloy catalyst formation to achieve the self-assembly of the nanostructures and to stabilize the growth.

Without intending to be limited by theory, the inventors have, through their own researches, trials, and experiments, devised that the VLS growth may occur without introducing any foreign metals, such as gold, tin and the like, as the catalytic seed for the NW growth, but making use of the vapor phase source directly to form a self-catalyst or auto-catalyst that could function as a catalytic seed in a similar manner as the typical liquid (eutectic) alloy catalyst. In an example embodiment, the halide perovskite NW formed by the method as described herein may have a single crystalline nature and no impurity phase.

According to the invention, there is provided a method of fabricating a halide perovskite having a general formula of ABX$_3$, wherein A, B, and X are inorganic elements and X is a halide, the method comprising a vapor-liquid-solid process triggered by a catalyst formed from a halide precursor of inorganic element B.

As used herein, the term "halide perovskite" (HP) particularly refers to the all-inorganic halide perovskites having the ABX$_3$ crystal structure, with A, B, and X all being inorganic elements, where X being a halide. For example, A may be Cs, B may be selected from Pb, Sn, In, or Tl, and X may be selected from Cl, Br, and I. In an embodiment, the halide perovskite may particularly refer to a lead (Pb) halide perovskite. For example, the halide perovskite having the general formula of ABX$_3$, may have A being Cs, B being Pb, and X being Cl, Br, or I.

In an embodiment, the halide perovskite, such as CsPbX$_3$ may be selected from a group comprising CsPbI$_3$, CsPbCl$_3$, and CsPbBr$_3$ nanowires (NWs). These nanowires may be about 5 µm to about 15 µm in length and about 110 nm to about 120 nm in diameter. These nanowires may also emit green light (such as emit at about 540 nm) along the entire length upon photoexcitation. As a result of the VLS process, the nanowire may be terminated with a spherical 5 catalytic tip, e.g., a Pb—X seed, where X is Cl, Br or I.

The halide perovskites obtained from the method as described herein, in particular CsPbX$_3$ such as CsPbI$_3$, CsPbCl$_3$, and CsPbBr$_3$ nanowires may comprise a monoclinic crystalline phase, which is believed to be advantageous for photoelectronic device applications, such as visible light photodetectors and phototransistors. In a specific embodiment, the nanowires may be fabricated as a visible light photodetector with the nanowire being dry-transferred to a Au electrode prefabricated on a SiO$_2$/Si substrate. In another embodiment, the nanowires may be fabricated as a phototransistor. The phototransistor may have a structure of bottom gate-top contact (BGTC), bottom gate-bottom contact (BGBC), bottom contact-top gate (BCTG), or top contact-top gate (TCTG). In a specific embodiment, the phototransistor may have a BGTC structure, with the nanowire being dry-transferred onto a SiO$_2$/Si substrate, and a Au electrode being fabricated onto the SiO$_2$/Si substrate by way of such as a shadow mask.

Turning now back to the method, the method is particularly a VLS process triggered by a catalyst formed from a halide precursor of inorganic element B (i.e., an inorganic halide compound having a general formula of $BX_n$, with B being selected from Pb, Sn, In, or Tl; X being selected from Cl, Br, or I; and n being a positive integer of 1 to 3). For example, when the inorganic element B is Pb or the halide perovskite is a lead halide perovskite have a general formula of $APbX_3$, such as $CsPbX_3$, the halide precursor of inorganic element B would be $PbBr_2$.

As used herein, the VLS process is preferably a one-step autocatalytic nucleation process. Such process involves a catalytic liquid droplet such as a Pb liquid droplet formed from a vapor-phase Pb source that gradually adsorbs a vapor to supersaturation levels, to transform into nucleated seeds such as $PbX_2$ seeds which may function as an alloying catalyst, allowing crystals (e.g., in the form of nanowires) to grow vertically at the liquid-solid interface on a growth substrate, particularly a roughened growth substrate. The term "vertically" means the nanowires grow perpendicular to the substrate, particularly along a crystal plane with a lower surface free energy than other crystal planes, such as along the (100) plane direction.

Before the autocatalytic VLS process, the method may comprise the step of preparing the catalyst by depositing the vapor-phase source such as the vapor-phase Pb source onto a roughened growth substrate. The method may also comprise the step of preparing the roughened growth substrate with an abrasive, particularly a coated abrasive such as a sandpaper of about 400 mesh to about 1200 mesh to generate scratched lines/grooves/notches at the substrate surface.

The inventor unexpectedly devised that a roughened growth substrate is a determining factor for the autocatalytic VLS process. In particular, it is found that the roughened surface would provide a higher surface energy to' the growth substrate and therefore facilitating the NW nucleation density on the roughened surface. As used herein, the roughened substrate is preferably a roughened $SiO_2$/Si growth substrate. Such a roughened growth substrate may have a root-mean-square (RMS) roughness of, for example, about 85 nm.

Also before the autocatalytic VLS process, the method may comprise the step of preparing the vapor-phase Cs, Pb, and X source, e.g., by mixing the halide precursors $PbX_2$ and CsX with a molar ratio of about 2:1 to form a halide precursor mixture. The method may further comprise the step of annealing the halide precursor mixture to suppress evaporation process of the mixture, such as at a temperature of about 420° C. for such as about 30 min. In this way, it is believed that the evaporation of source material and the deposition of vapor-phase source during the VLS process would occur simultaneously, achieving a one-step autocatalytic VLS process (as discussed in later part of the present disclosure). As such, it is believed that the fabricated perovskite NW would have a flat and smooth wire body surface rather than a distorted and expanded one.

In an embodiment, the autocatalytic VLS process may be conducted in a two-zone CVD system such as a tube furnace having a first heating region/zone (i.e., upstream region/zone) with a higher temperature, and a second heating region/zone (i.e., the downstream region/zone) with a lower temperature. The prepared source materials may be placed in the first heating region with a set temperature of about 400° C. to about 500° C. and the roughened growth substrate may be placed in the second heating region with a set temperature of about 250° C. to about 350° C. The second heating region may also have a pressure of about 0.5 Torr to about 1.8 Torr, and include a carrier gas flow with Ar at about 80 sccm to about 110 sccm.

In particular, the roughened growth substrate may be placed in the second heating region at a distance of about 10 cm to about 20 cm, about 12 cm to about 18 cm, about 12 cm to about 17 cm, about 13 cm to about 17 cm, about 14 cm to about 17 cm, or about 15 am to about 17 cm away from the halide precursor mixture (i.e., the prepared source material). It is believed that by placing the roughened growth substrate at a certain distance away from the prepared source material, it would facilitate the nucleation of the NWs of the present invention and minimize the nucleation and therefor the formation of bulk clusters.

It is believed that the formation of catalytic liquid droplet is crucial in the VLS process. As mentioned herein, the VLS process of the present invention is an autocatalytic VLS process and the catalytic liquid droplet is formed from the halide precursor rather than from a foreign (metal) atom (i.e., atoms generated from materials other the halide precursor). To enable such a catalytic liquid droplet formation, the temperature in the first heating region may be set between the melting points of the halide precursors $PbX_2$ such as $PbBr_2$ and CsX such as CsBr, such that the one with a lower melting point than the set temperature will be evaporated first. For example, when the halide precursors are $PbBr_2$ and CsBr, the temperature of the first heating region may be set at, for example, about 480° C., such that the lower melting point $PbBr_2$ (373° C.) will be first evaporated from the halide precursor mixture before the higher melting point CsBr (636° C.).

The vapor-phase Pb source will be directed to the second heating region along with the carrier gas. As a result of the temperature gradient established between the first and the second heating regions, the vapor-phase Pb source will be deposited onto the growth substrate, particularly at the area with higher surface energy such as the roughened/scratched region of the growth substrate, and nucleate to form liquid droplets. The Pb liquid droplets may then act as active sites for (subsequent) catalytic NW nucleation.

The catalytic Pb liquid droplets may gradually become supersaturated with the continuous adsorption of halide X such as $Br_2$ from the vapor-phase X source, forming a (molten) $PbBr_2$ alloyed droplet which may function as an intermediate catalyst (i.e., $PbBr_2$ alloying catalyst) to nucleate and form $PbBr_2$ solid seeds. Once the $PbBr_2$ seeds are formed, the (molten) $PbBr_2$ alloyed droplet may be supersaturated through the addition of the vapor-phase Cs, Pb, and X sources. It is believed that the $CsPbX_3$ structure such as $CsPbBr_3$ structure may have a relatively low formation energy and stable crystal structure, and therefore it is expected that the supersaturated $CsPbBr_3$ would be grown in a vertical manner as defined herein. The growth conditions may be maintained for a predetermined period of time, such as about 50 mins to about 80 mins.

Hereinafter, the present invention is described more specifically by way of examples using a self-catalyzed $CsPbBr_3$ NW, but the present invention is not limited thereto.

EXAMPLES

Materials and Reagents Used

All chemical sources purchased from Sigma-Aldrich without any further purification process. The commercial p-type Si wafer, with a 50 nm thick thermal oxide layer, was used as the smooth substrate. The scratched substrate was surface-roughened by the 1200 and 400 mesh sandpapers. Before use, all the growth substrates were ultrasonically cleaned with pure deionized water, ethanol, and acetone, and blow-dried through a nitrogen gun.

The CsPbBr$_3$ nanowires (NWs) used in this work were synthesized as follows: Source powder was prepared by mixing 100 mg of PbBr$_2$ and 70 mg of CsBr powder in an agate mortar and then grinded for 15 min. After that, the well-mixed source powder was annealed at 420° C. for 30 min at atmosphere before being placed into the tube furnace to suppress the evaporation process of precursors. In a two-zone CVD system comprising a first heating zone and a second heating zone, the prepared source powder was placed in the center of the upstream side of the quartz tube (i.e., the first heating zone), whereas the scratched SiO$_2$/Si wafer was placed in the downstream side of the quartz tube (i.e., the second heating zone), at a distance about 15 cm away from the precursor powder.

After that, the CVD system was evacuated to a base pressure of 8 mTorr and then 100 sccm Ar gas was released to flow through the tube furnace. The eventual growth pressure was regulated to 1.5 Torr. Then, the first heating zone was set to heat up slowly to 480° C. in 50 min and keep at that temperature for 20 min, while the second heating zone was set to 330° C. with the same procedure. That said, the overall growth conditions are maintained for about 70 mins. The heating temperature of source powder is 480° C., lower to its melting point (e.g., CsBr of 636° C.); therefore, a sublimation process is happened here to generate the vapor source.

The photodetectors based on single CsPbBr$_3$ NWs were prepared by dry transfer of NWs on a processed substrate with Au electrodes (50 nm thick) prefabricated with a channel length of 2 μm. The Au electrodes were constructed by standard lithography and metallization on the substrate surface (50 nm thick SiO$_2$/Si). A standard electrical probe station connected to a semiconductor analyzer (Agilent 4155C) was utilized to assess the electrical property of the NWs. Laser diodes of 405 nm were used as the light source for the photodetection measurement. A PM400 power meter (Thorlabs) was used to detect the power of the incident irradiation. The TBS 1102B-EDU digital oscilloscope (Tektronix) was connected with a SR570 current preamplifier (Stanford Research Systems) to measure the high-precision photoresponse speed.

Instrumentation and Characterization

The morphology of NWs was evaluated by using scanning electron microscope (SEM, quanta 450 FEG, FEI) and transmission electron microscope (TEM, Philips CM20). The crystalline structure was initially determined by the X-ray diffraction pattern (D2 Phaser Cu Kα radiation, Bruke), and further verified through the high-resolution transmission electron microscopy (HRTEM, JEOL 2100F). The elemental analysis was carried out using the energy dispersive X-ray (EDX) detector connected with JEOL 2100F. The photoluminescent property of the NWs was tested by photoluminescence spectroscopy (iHR320) with an excitation wavelength of 400 nm. As for the scratched substrate, an atomic force microscopy (Bruker Dimension Icon AFM) was employed to check its surface morphologies.

Example 1A

Preparation of CsPbBr$_3$ Perovskite NWs

The schematic growth system of CsPbBr$_3$ Perovskite NWs is illustrated in FIG. 1. Specifically, the freestanding CsPbBr$_3$ perovskite NWs were grown on surface-roughened SiO$_2$/Si substrates (50 nm thick thermal oxide) via the chemical vapor deposition (CVD) process in a two-zone tube furnace. A mixture of PbBr$_2$ and CsBr powders with about 2:1 molar ratio was grinded and placed at the center of the upstream heating zone (i.e., a first heating zone) of a quartz tube. Before the growth, the roughened substrate was prepared by controlled scratching process and positioned in the downstream heating zone (i.e., a second heating zone), which is about 15 cm away from the precursor powders (i.e., Pos I of FIG. 1). Meanwhile, 100 sccm of high-purity argon gas was injected into the CVD system, with the pressure kept at 1.5 Torr. During the growth process, the upstream heating zone was heated up to 480° C. and held at that temperature for 20 min, while the downstream zone was set to the similar process with a heating temperature of 330° C. After deposition, the entire system was naturally cooled to room temperature and a mass of orange and yellow products were obtained on the substrates.

Example 2A

Characterization of CsPbBr$_3$ Perovskite NWs

Figure 2B:
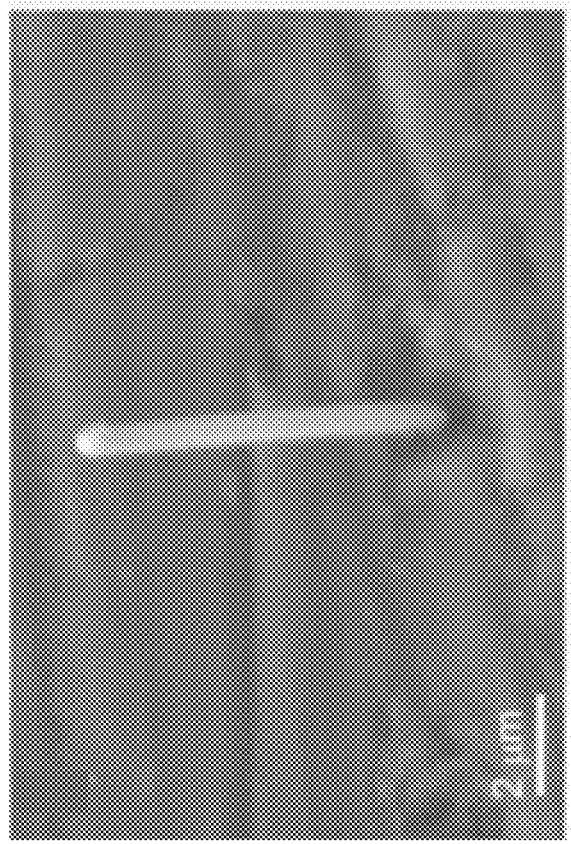
FIG. 2B is a high-resolution SEM image of a CsPbBr$_3$ NW vertically grown on the "scratched" point.
Figure 2A:
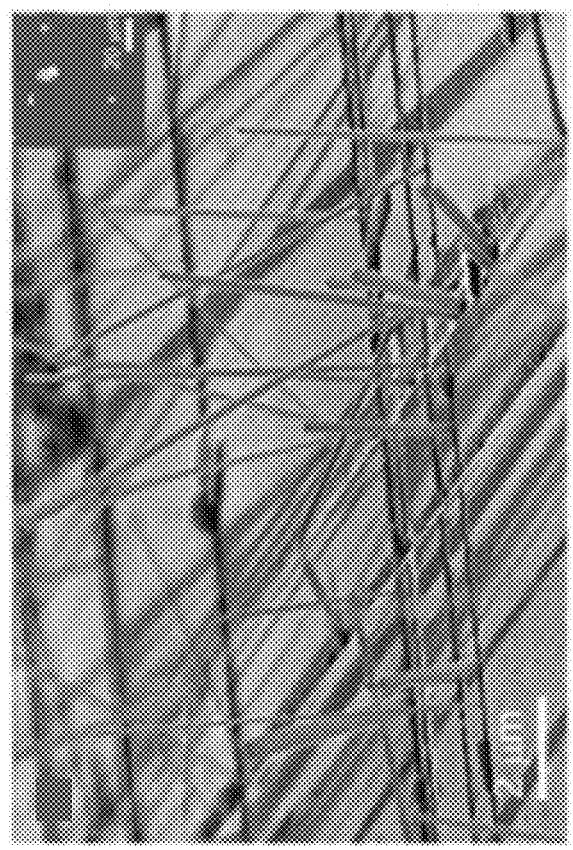
FIG. 2A is a scanning electron microscope (SEM) image of CsPbBr$_3$ NWs grown on the surface roughened SiO$_2$/Si substrate. The insert is an enlarged image showing the bulk clusters grown on the smooth surface under the same growth conditions.
Figure 3B:
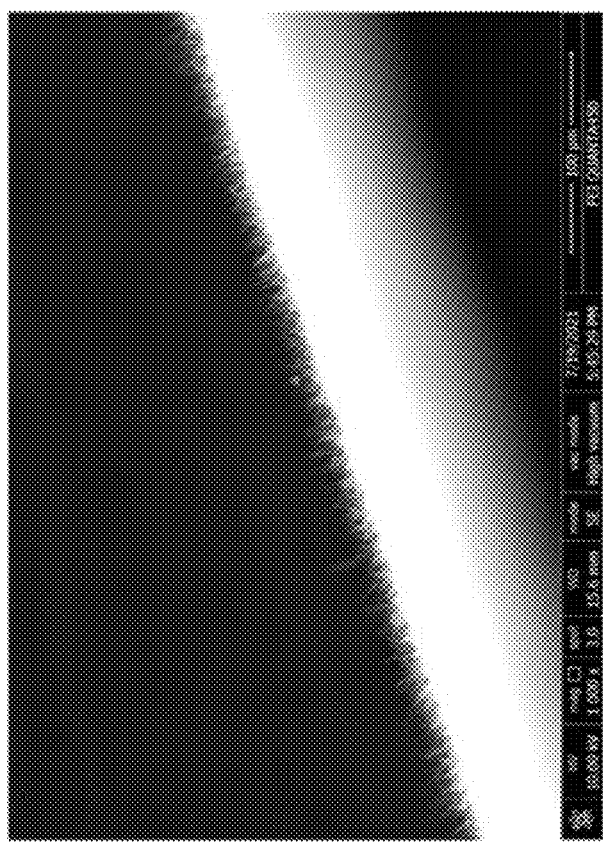
FIG. 3B is a SEM image showing the cross-section view of the as-grown CsPbBr$_3$ NWs of FIG. 3A.
Figure 3A:
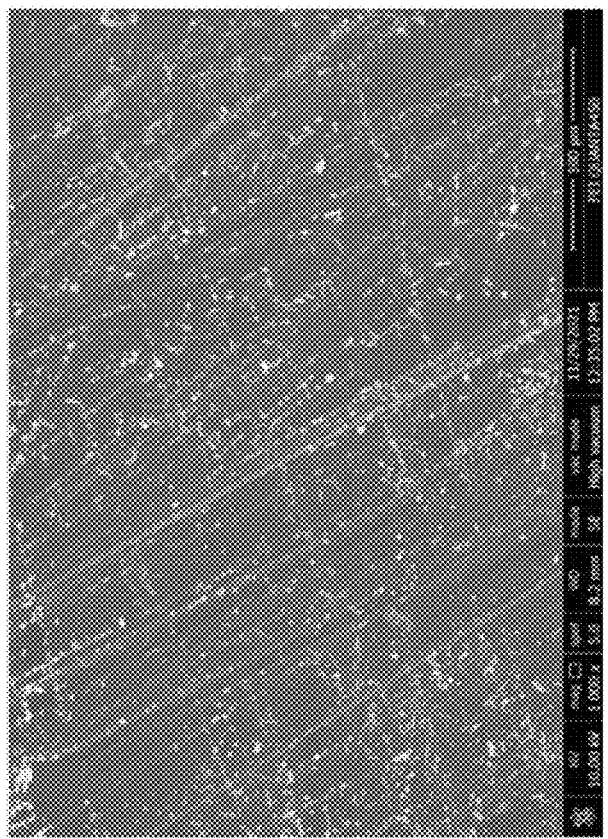
FIG. 3A is a SEM image showing the top-view of the as-grown CsPbBr$_3$ NWs.

Scanning electron microscopy (SEM) was adopted to evaluate the morphology of as-grown NWs. As shown in FIG. 2A, vertical NWs are readily fabricated on the surface-roughened substrate, whereas almost all the NWs are grown along the "scratched" lines. On the contrary, as depicted in the inset image, bulk clusters are only formed on the smooth substrate under the same growth condition. Notably, the obtained NWs are straight and smooth with a clearly observable spherical tip, suggesting a self-catalyzed VLS growth process here (FIG. 2B). The top-view and cross-sectional view SEM images of the NWs are shown in FIGS. 3A and 3B.

Figure 4B:
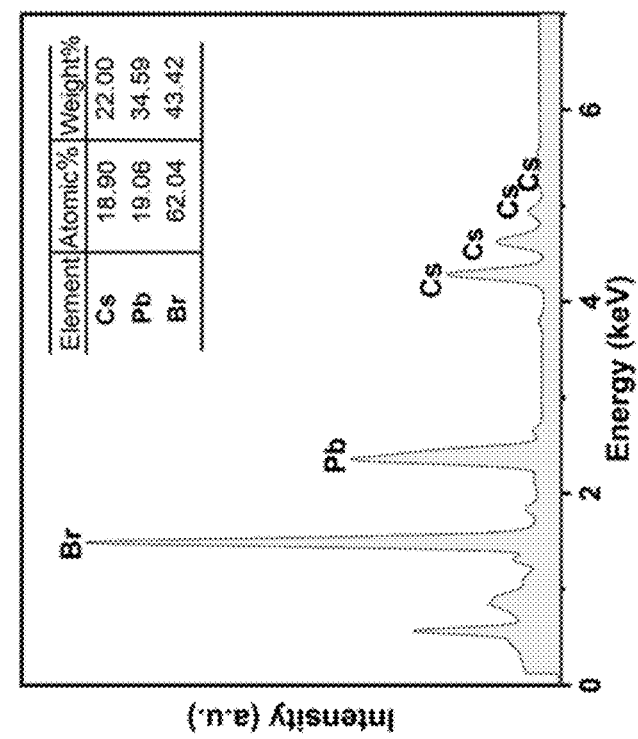
FIG. 4B is an EDS spectrum of the self-catalyzed CsPbBr$_3$ NWs.
Figure 4A:
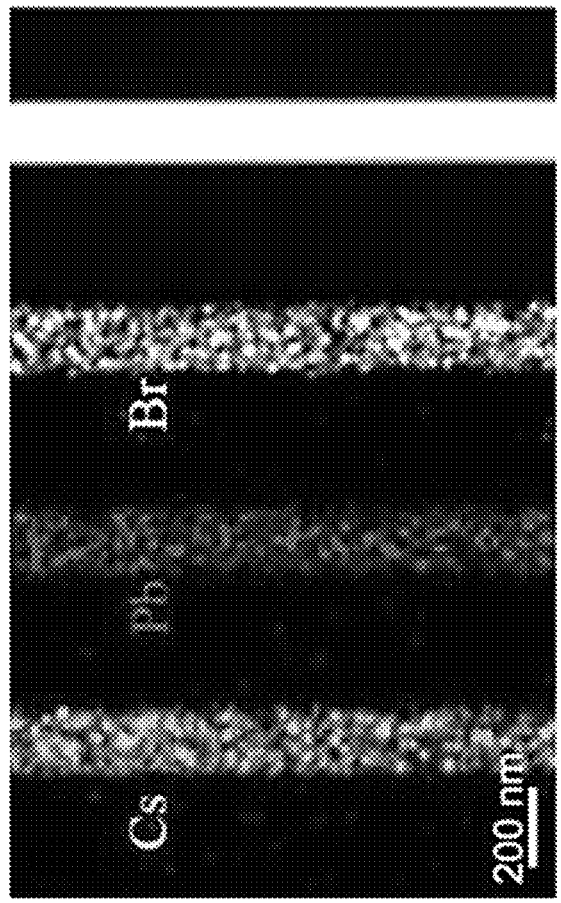
FIG. 4A is an EDS elemental mapping showing Cs (green), Pb (red), and Br (yellow) and the corresponding high-angle dark-field STEM image.

Elemental analysis was performed on the NWs via energy-dispersive X-ray spectroscopy (EDS) mapping. As shown in FIG. 4A, Cs, Pb, and Br are uniformly distributed along the NW body. In addition, the EDS spectrum indicates that the composition ratio of Cs, Pb, Br is close to 1:1:3 (FIG. 4B), agreeing well with the stoichiometric ratio of CsPbBr$_3$.

Figure 5:
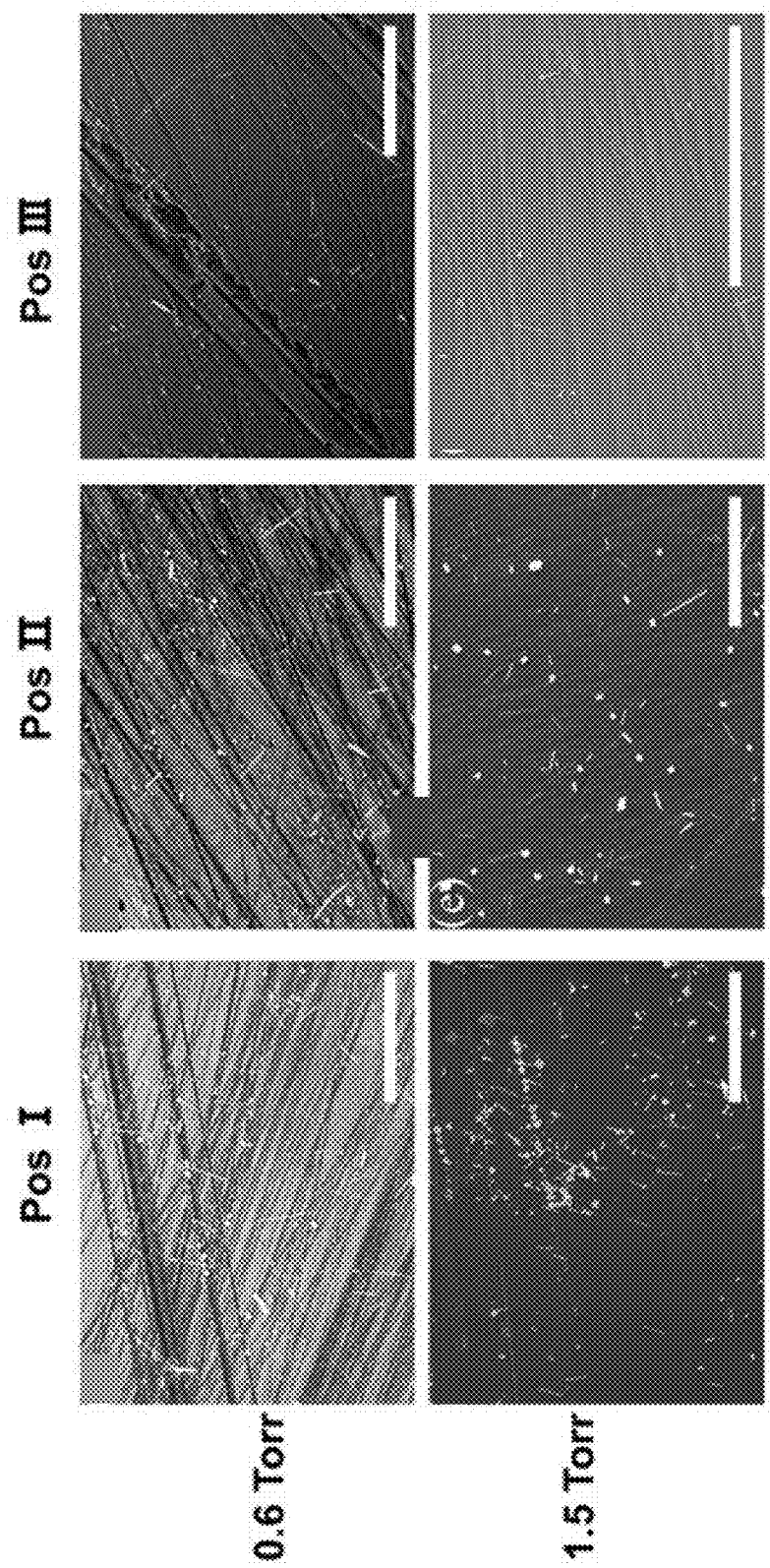
FIG. 5 is a series of SEM images showing the self-catalyzed CsPbBr$_3$ NWs grown at different positions in the second heating zone and under different gas pressure. Scale bar=50 μm.

The influence of gas pressure and location of substrate to the NW growth was also investigated. As shown in FIG. 5, when the gas pressure is increased, the nucleation density of bulk clusters would decrease obviously; and when distance between substrate and precursor is increased (from about 15 cm (Pos I) to about 17 cm (Pos III) away from the precursor), the nucleation density of bulk clusters would decrease dramatically and the NWs formed on the scratched lines would be more remarkable.

The crystal quality and phase purity of the self-catalyzed NWs have been investigated by powder X-ray diffraction (XRD), photoluminescence (PL), X-ray photoelectron spectroscopy (XPS), and transmission electron microscopy (TEM).

Figure 6:
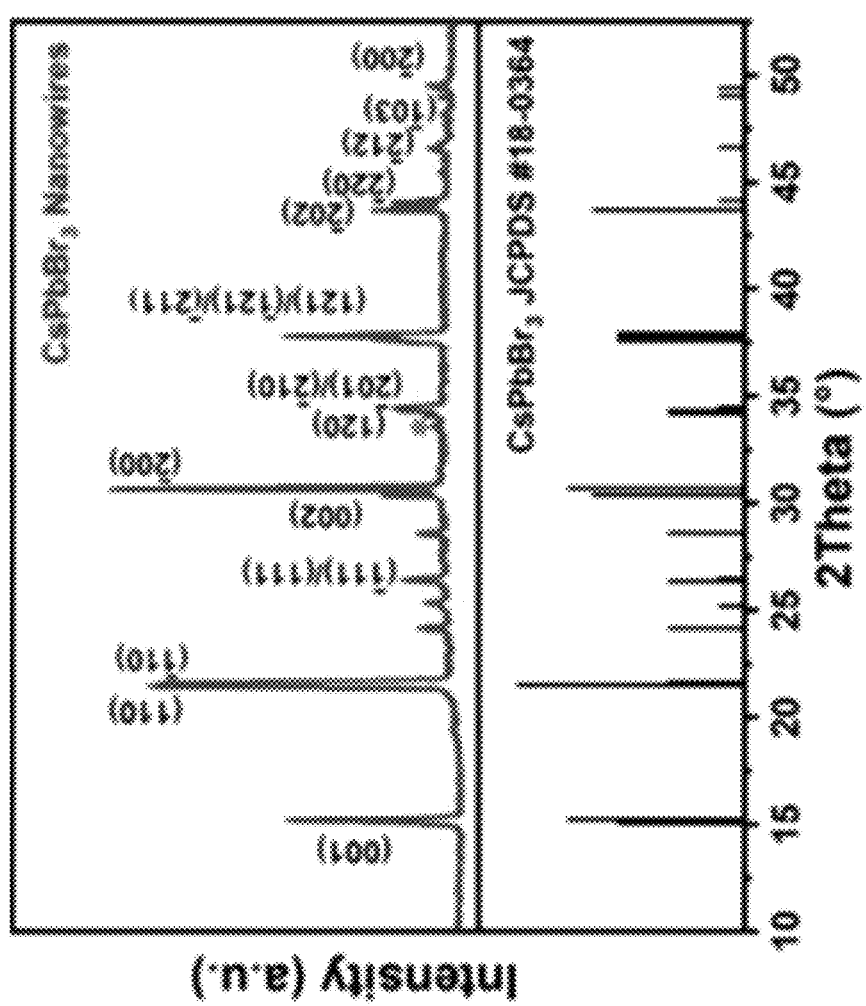
FIG. 6 is an X-ray diffraction (XRD) spectrum of the self-catalyzed CsPbBr$_3$ NWs.
Figure 7:
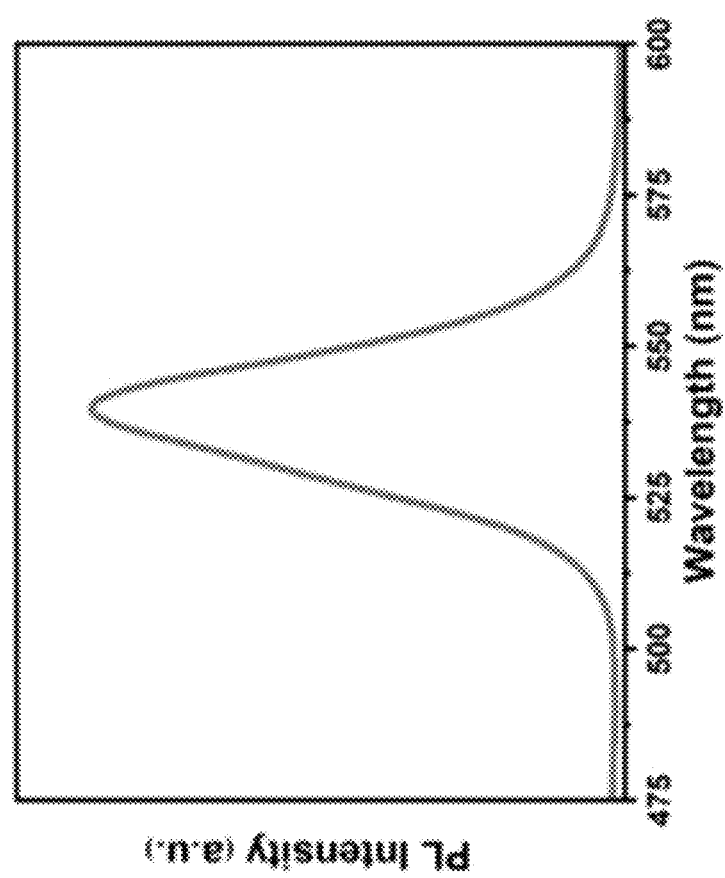
FIG. 7 is a normalized photoluminescence (PL) spectrum of the self-catalyzed CsPbBr$_3$ NWs, excited at about 450 nm.
Figure 8D:
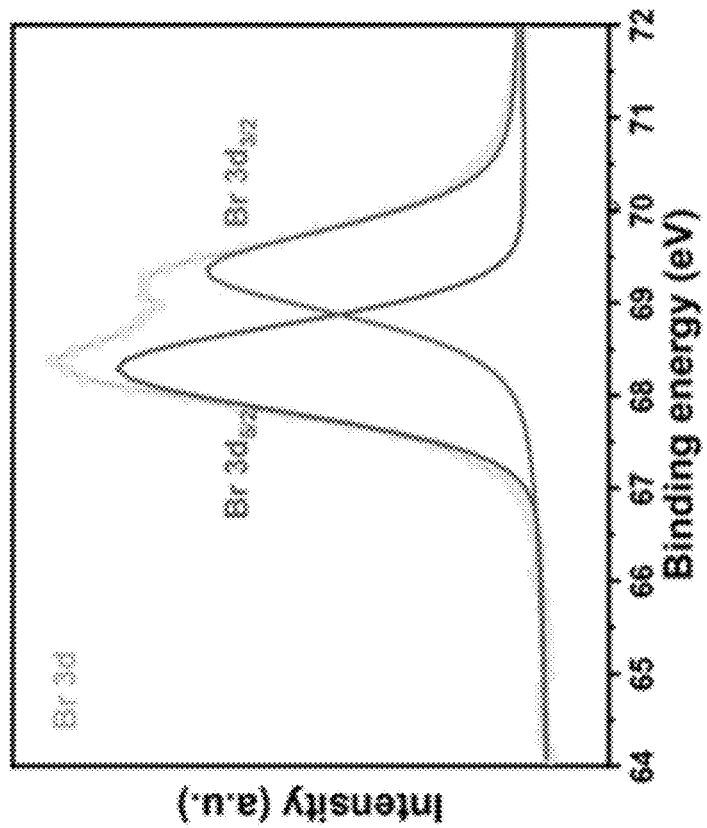
FIG. 8D is an enlarged XPS spectrum of FIG. 8A showing the Br 3d peaks.
Figure 8C:
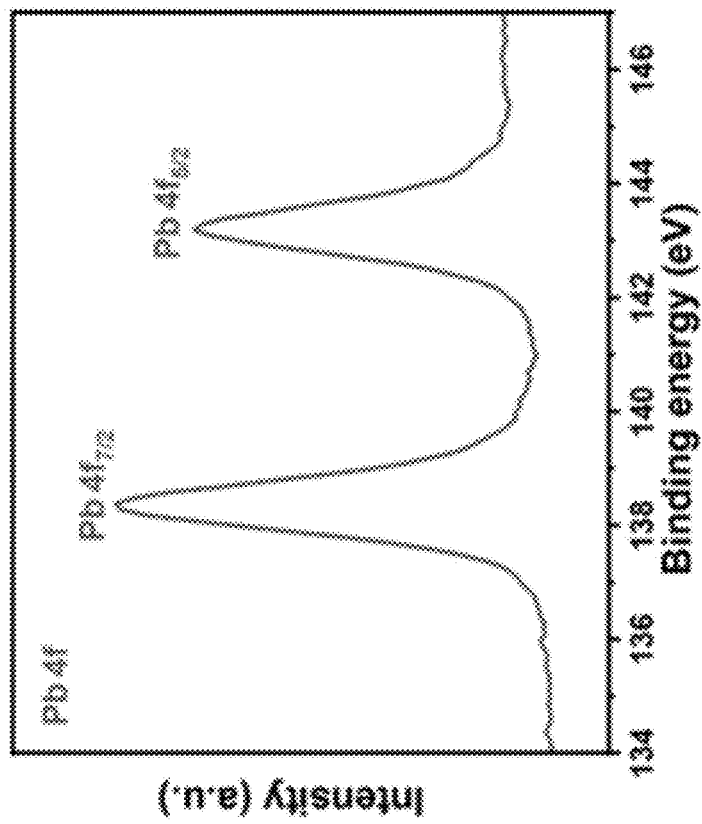
FIG. 8C is an enlarged XPS spectrum of FIG. 8A showing the Pb 4f peaks.

As shown in FIG. 6, all the diffraction peaks of as-fabricated NWs are clearly indexed to monoclinic CsPbBr$_3$ (JCPDS #18-0364). Referring now to FIG. 7, the PL spectrum of the NWs shows a sharp characteristic emission peak at about 540 nm, which further indicates the monoclinic nature of the CsPbBr$_3$ NWs of the present invention. Also, as shown in the XPS spectra (FIGS. 8A to 8D), all the peaks of Cs 3d$_{5/2}$, Cs 3d$_{3/2}$, Pb 4f$_{7/2}$, Pb 4f$_{5/2}$, Br 3d$_{5/2}$, and Br 3d$_{3/2}$ can be well identified, while no impurity associated peaks are detected. All these results evidently suggest that the NWs obtained from the self-catalytic perovskite NW growth of the present invention is crystalline and phase pure.

Figure 9:
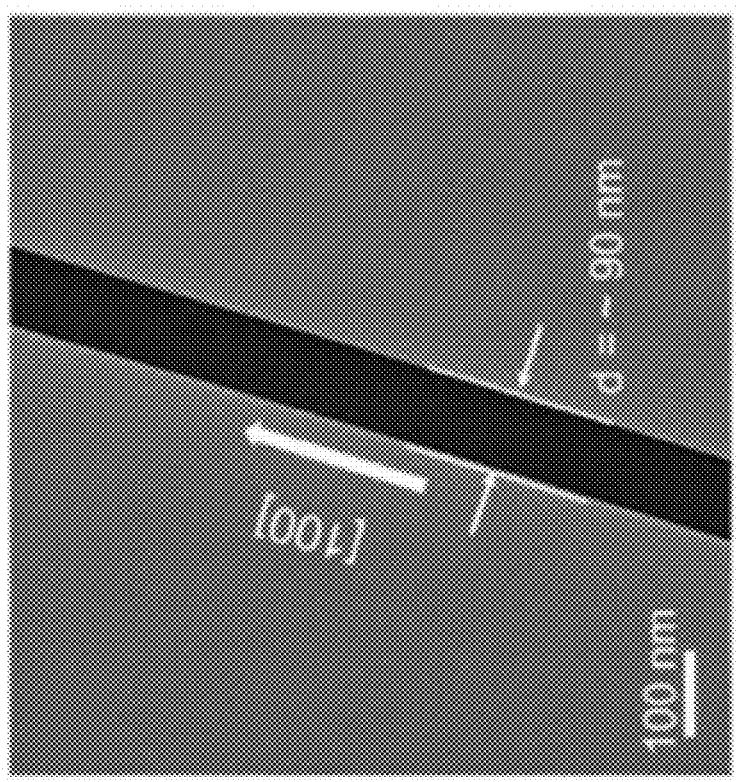
FIG. 9 is a transmission electron microscopy (TEM) image of the self-catalyzed CsPbBr$_3$ NWs.
Figure 10B:
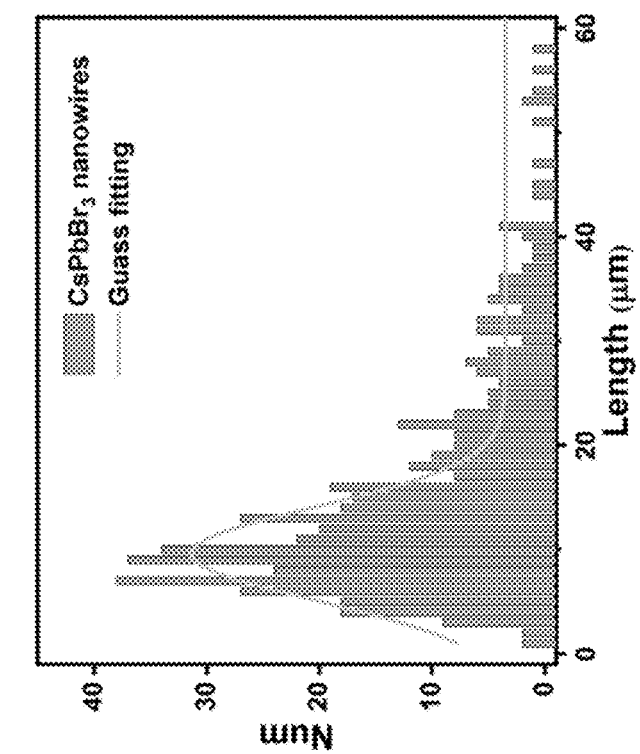
FIG. 10B a plot showing the length statistics of the CsPbBr$_3$ NWs grown on surface-roughened substrate.
Figure 10A:
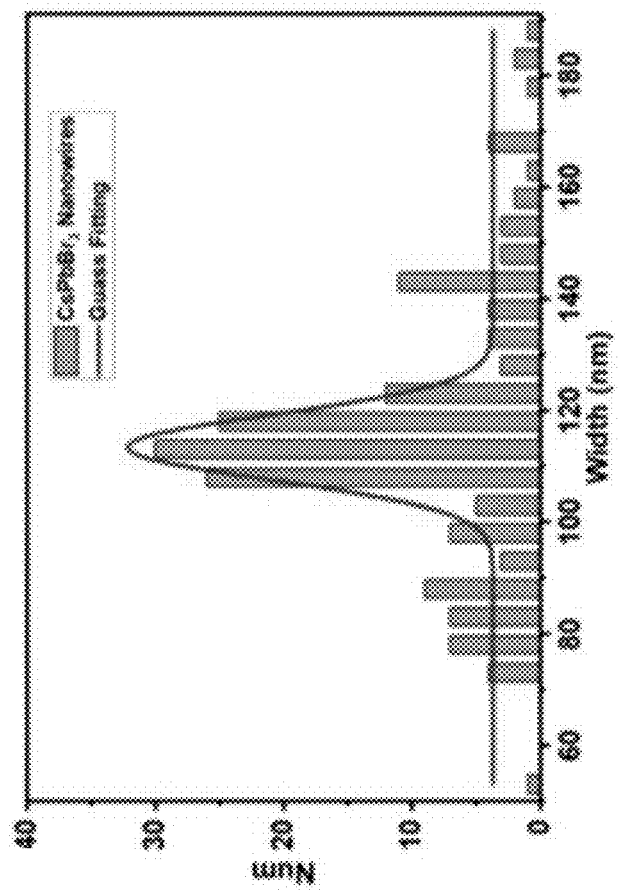
FIG. 10A is a plot showing the diameter statistics of the CsPbBr$_3$ NWs grown on surface-roughened substrate.
Figure 11B:
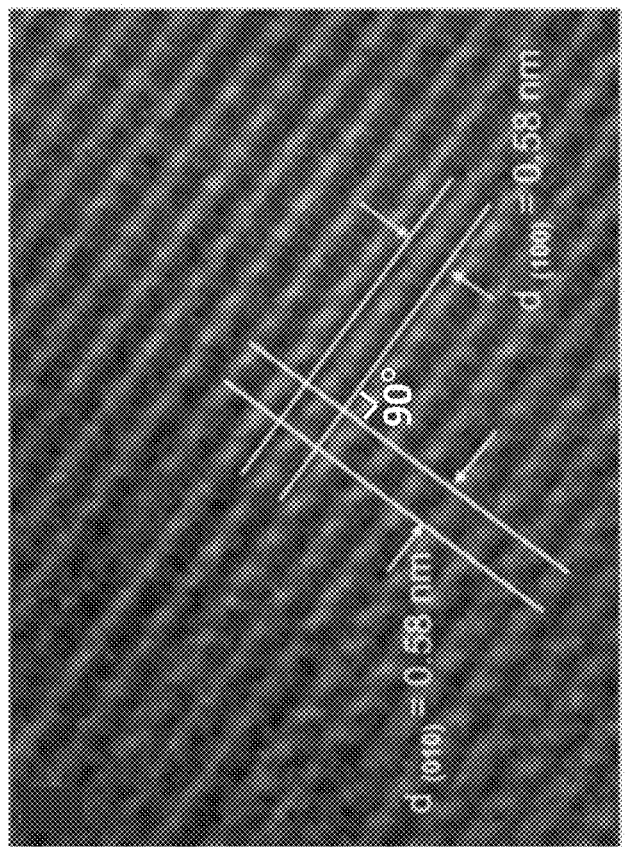
FIG. 11B is an enlarged HRTEM image of FIG. 11A illustrating the spacing of two adjacent lattice planes.
Figure 11A:
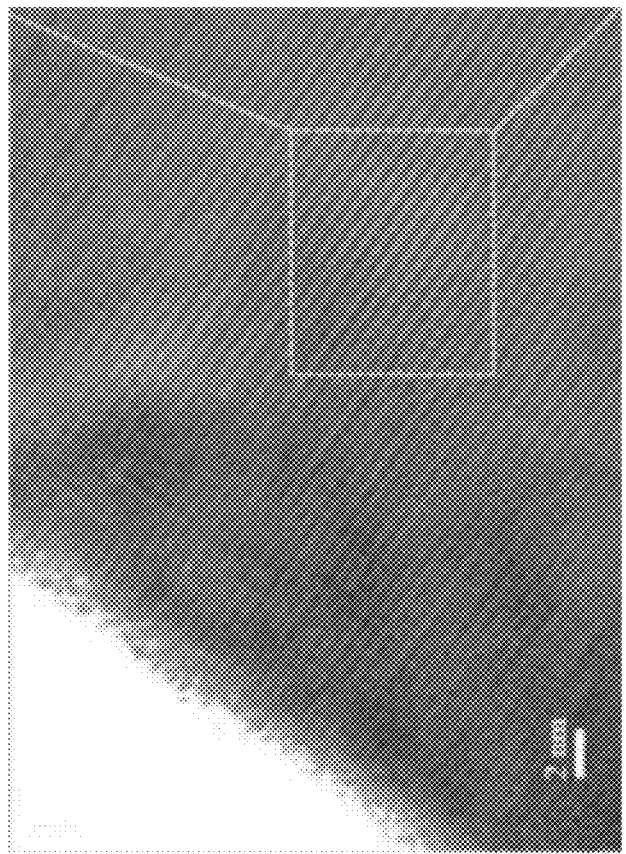
FIG. 11A is a high-resolution TEM (HRTEM) image of the CsPbBr$_3$ NWs.
Figure 11C:
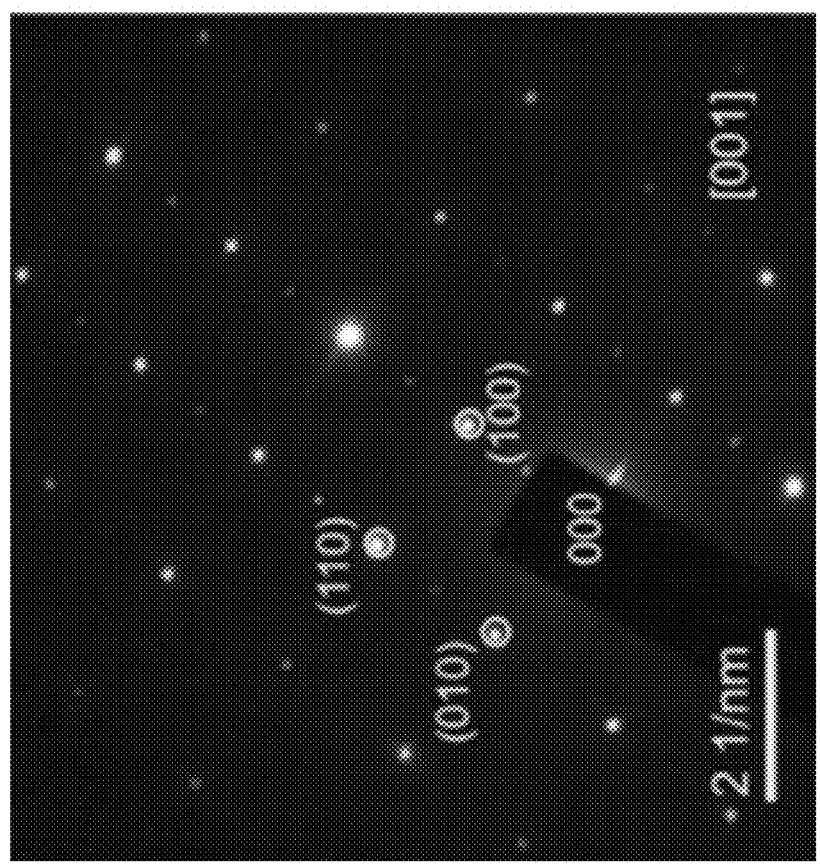
FIG. 11C is an image showing the corresponding selected-area electron diffraction (SAED) pattern of FIG. 11A.

Transmission electron microscopy (TEM) and selected-area electron diffraction (SAED) were utilized to further evaluate the crystallinity of self-catalyzed NWs. As shown in FIG. 9, the diameter of a representative NW is around 90 nm, while its surface is very smooth. The diameter distribution of the CsPbBr$_3$ NWs grown on surface-roughened substrate was assessed from the TEM images and illustrated in FIG. 10A. The corresponding length distribution was provided in FIG. 10B. When the high-resolution mode was applied, clear lattice fringes were observed in FIG. 11A, which infers the single-crystalline nature of NW without any impurity phase. The spacing between two adjacent lattice planes is found to be 0.58 nm, which corresponds to the (100) plane of monoclinic CsPbBr$_3$ (FIG. 11B). The corresponding SAED pattern confirms that the NW is grown along the direction (FIG. 11C), agreeing perfectly with the high-resolution TEM (HETEM) result. It is worth mentioning that hundreds of NWs have also been characterized with the same process, and almost all of them exhibit the same growth orientation of [100]. This particular growth orientation is believed to be a result of the CsPbBr$_3$ preference to grow on the (100) (crystal) plane which has a lower calculated surface free energy as compared with other crystal planes.

Example 2B

Effect of Substrate Surface Roughness on CsPbBr$_3$ Perovskite NWs Growth

Figures 12A, 12B:
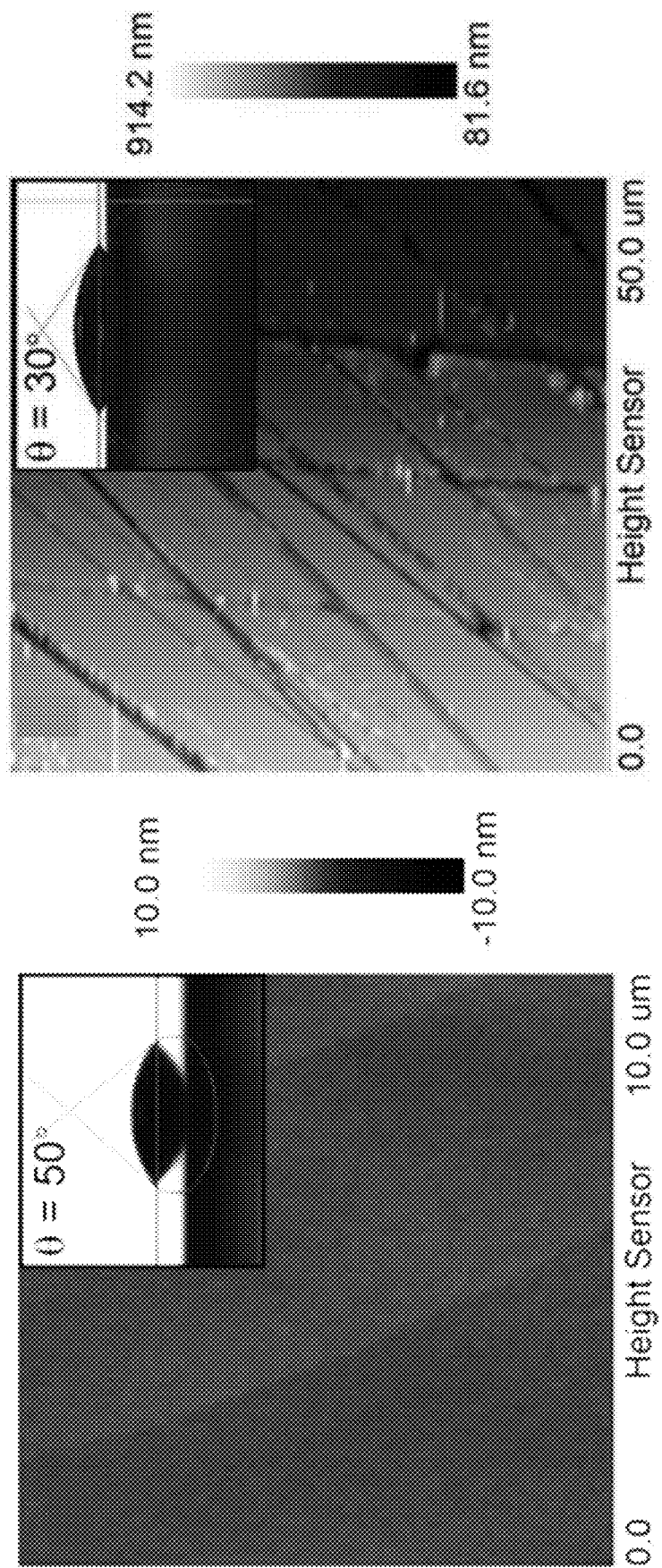
FIG. 12A is an atomic force microscopy (AFM) image of a smooth SiO$_2$/Si substrate. The insert is an image illustrating the corresponding water contact angle on the surface.
FIG. 12B is an AFM image of a surface roughened SiO$_2$/Si substrate prepared by a 1200 mesh sandpaper. The insert is an image illustrating the corresponding water contact angle on the surface.
Figures 13A, 13B:
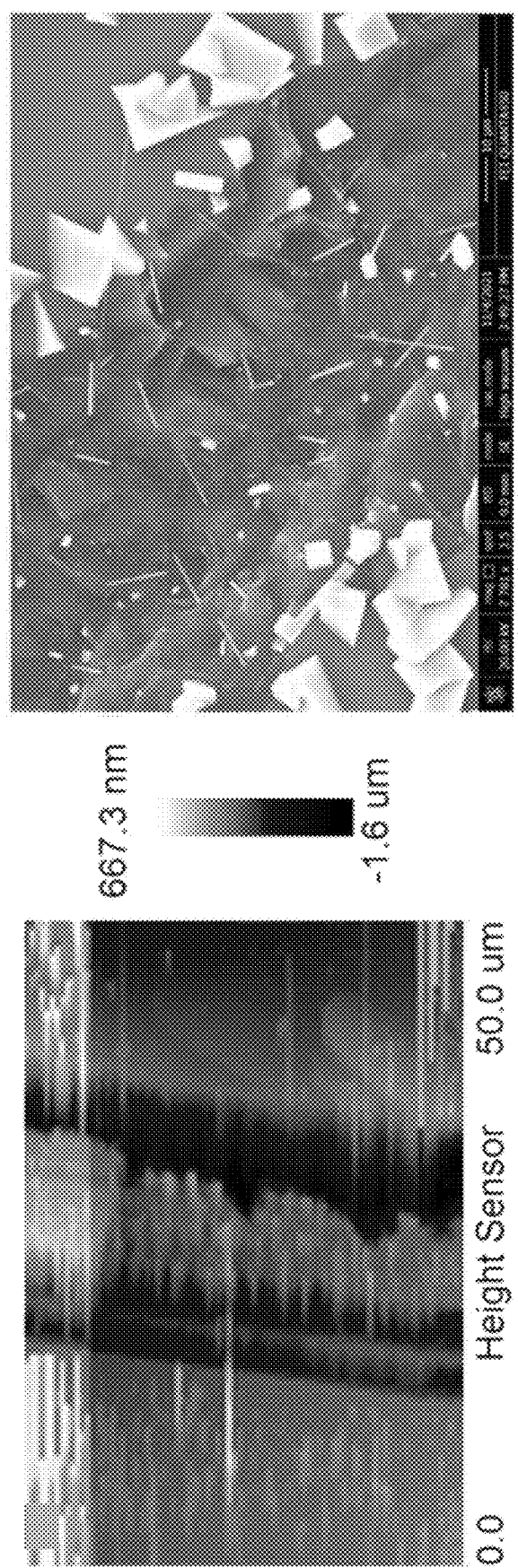
FIG. 13A is an AFM image of a surface roughened SiO$_2$/Si substrate prepared by a 400 mesh sandpaper.
FIG. 13B is a SEM image showing the NW growth on the surface roughened SiO$_2$/Si substrate of FIG. 13A.

To investigate the impact of substrate surface roughness on the growth of vertical NWs, the surface morphology of SiO$_2$/Si substrates with different surface roughness were studied by atomic force microscopy (AFM). For the initial smooth substrate, as shown in FIG. 12A, the peak height is up to 10 nm and the root-mean-square (RMS) roughness is measured to be 0.2 nm. Once the substrate is controllably scratched by sandpaper (1200 mesh), scratch lines are clearly witnessed on the surface with the peak height close to 914.2 nm and the RMS roughness of 84.7 nm (FIG. 12B). For the surface-roughened substrate processed with 400 mesh sandpaper, the height region comes to a range of −1.6 to 0.7 µm (FIG. 13A).

Control experiments of NW growth were then performed on the SiO$_2$/Si substrates with and without the scratching process. As shown in FIGS. 13B and 14A to 14C, the formation of NWs is distinctly less in the unscratched substrate as compared with that in the scratched substrate.

Figure 14B:
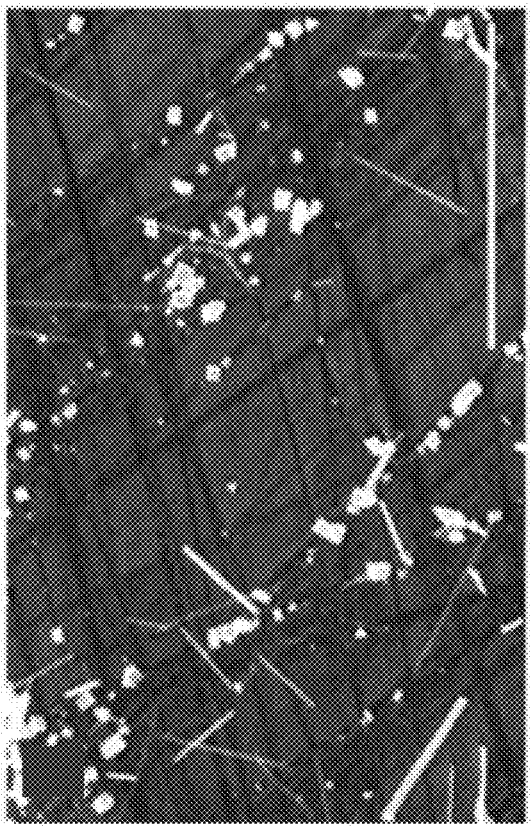
FIG. 14B is a SEM image illustrating the NW grown on the surface roughened region of the substrate of FIG. 14A.
Figure 14C:
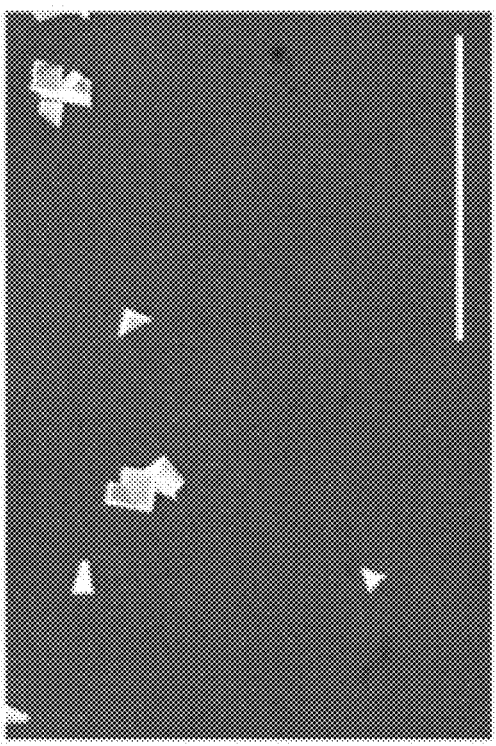
FIG. 14C is a SEM image illustrating the NW grown on the smooth surface region of the substrate of FIG. 14A.
Figure 14A:
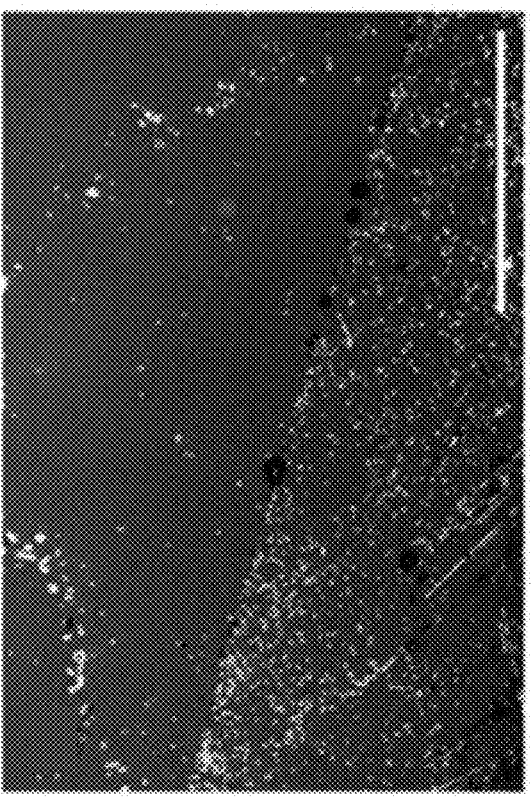
FIG. 14A is a SEM image illustrating the growth comparison of the NW grown the smooth region and the surface roughened region of a substrate.

To understand the relationship between NW growth and substrate feature, contact angle measurement on SiO$_2$/Si substrates with and without the scratching process was performed. It is believed that the contact angle characterization could provide quantitative data about surface energy of different substrates. According to the Young's equation, the contact angle (θ) between flat substrate and water droplet satisfy the relationship of $\gamma_s = \gamma_L \cos\theta + \gamma_{SL}$, in which $\gamma_s$, $\gamma_L$ and $\gamma_{SL}$ are the surface energy of solid substrate, the surface tension of liquid droplet, and the interfacial tension between liquid and solid, respectively. As illustrated in FIGS. 12A and 12B, the scratched substrate possesses a smaller contact angle of 30° than that of the smooth substrate of 50°. This phenomenon indicates that the scratching process could increase the surface energy of SiO$_2$ substrate, and later enhance the NW nucleation density on its surface, which support the findings that the samples prefer nucleate on the high surface energy area (FIGS. 14A to 14C).

Example 2C

Growth Mechanism of CsPbBr$_3$ Perovskite NWs

Figure 15A:
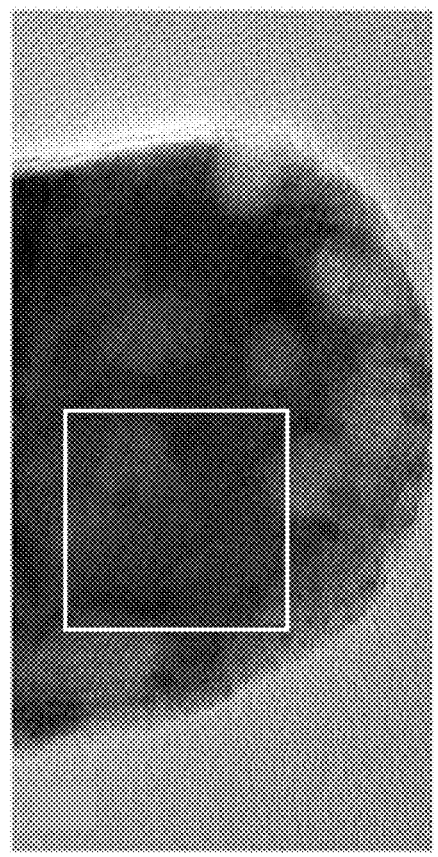
FIG. 15A is a HRTEM image showing the tip of the CsPbBr$_3$ NW.
Figure 15B:
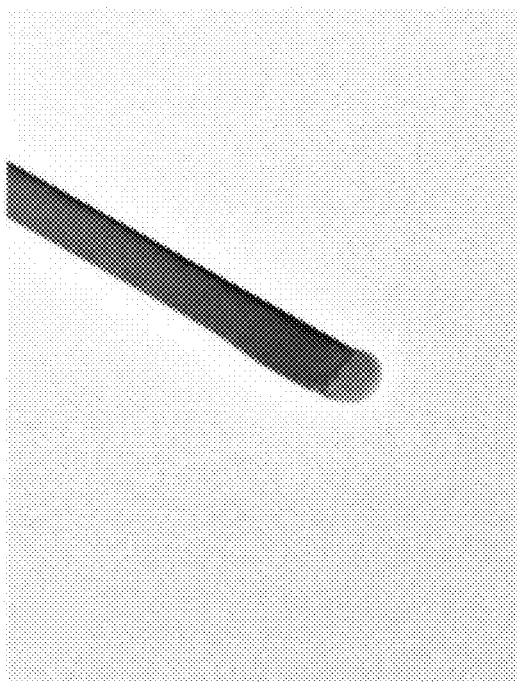
FIG. 15B is a HRTEM image with the tip of the CsPbBr$_3$ NW of FIG. 15A being enlarged.
Figure 15C:
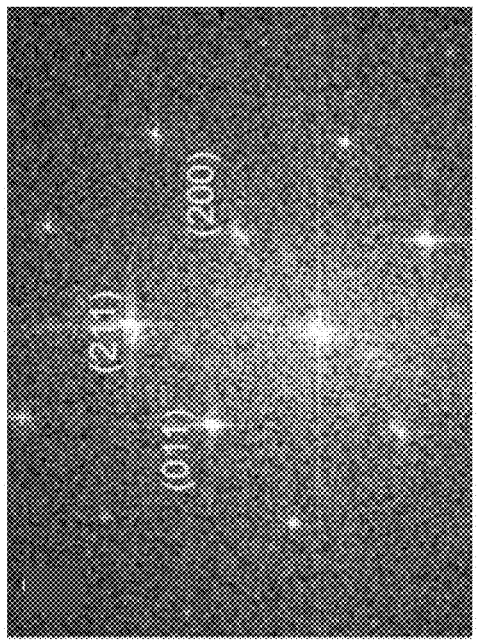
FIG. 15C is an image showing the SAED pattern of the NW tip of FIG. 15B.

To confirm if the growth of the CsPbBr$_3$ Perovskite NWs is via the VLS growth process, at the first instance, HRTEM images were taken on the NW tip region. As shown in FIG. 15A, a characteristic spherical seed is evidently observed, indicating the occurrence of VLS growth process. It is noteworthy that the lattice fringes and corresponding diffraction patterns are also collected from the tip (FIGS. 15B and 15C), revealing the existence of the catalytic PbBr$_2$ seed. To this end, it is believed that the growth process of the CsPbBr$_3$ NWs of the present invention is a one-step process, since if otherwise, defective features of the two-step growth process, i.e., distorted NW surfaces and distorted orientation as a result of induced volume expansion in chemical conversion PbX$_2$ process and the uncontrolled strain during formation of NWs, should have been observed.

In addition, in view of the fact that there is no foreign catalyst is used in the present invention, a one-step self-catalytic VLS mechanism is therefore proposed. It is believed that in III-V NWs, the formation of catalytic liquid droplets is vital to VLS growth. In the present invention, it is believed that since the melting point of CsBr (636° C.) is much higher than that of PbBr$_2$ (373° C.), PbBr$_2$ will be first evaporated from precursor prior to CsBr. After the gas source comes into zone II (i.e., the second heating zone/substrate zone) with the flow of argon, the gas source will nucleate preferably at the high surface energy area on substrates due to the decline of temperature. Given that it is evident from the above that, the scratched lines have a higher surface energy compared to the smooth area, thus being preferable sites for the formation of Pb droplets.

Figure 16A:
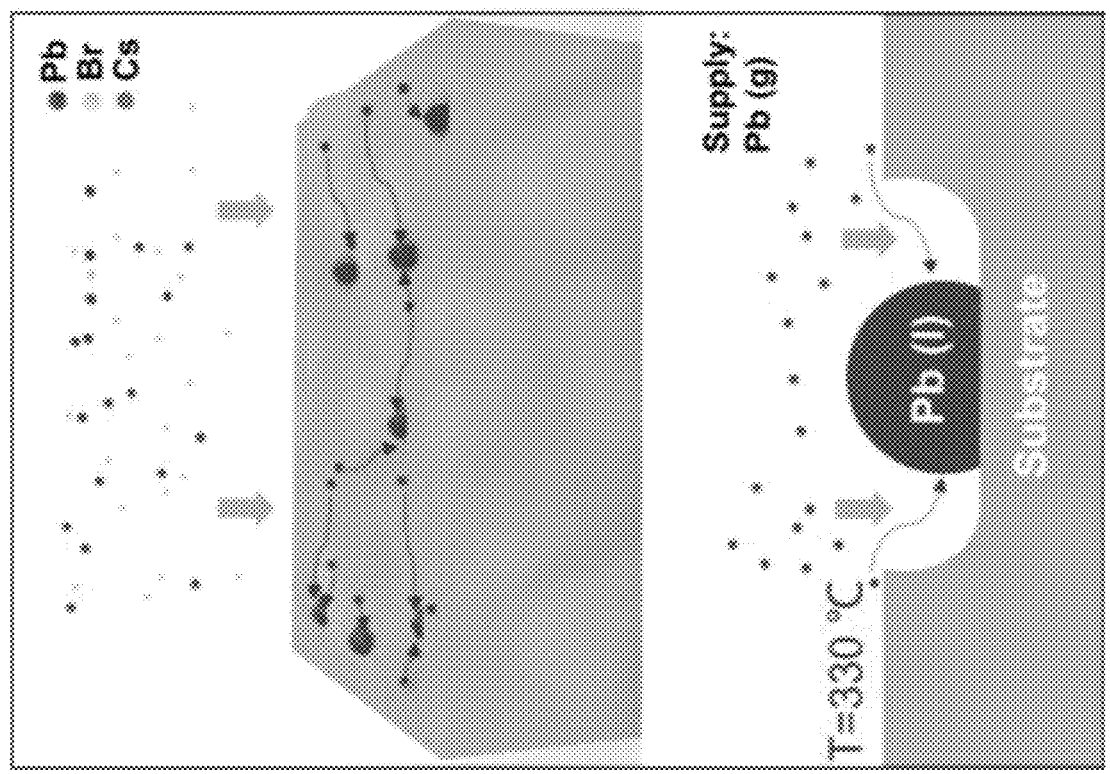
FIG. 16A is a schematic diagram of different growth stages of CsPbBr$_3$ NWs, illustrating the stage of forming large Pb droplets on the surface roughened substrate.
Figure 16B:
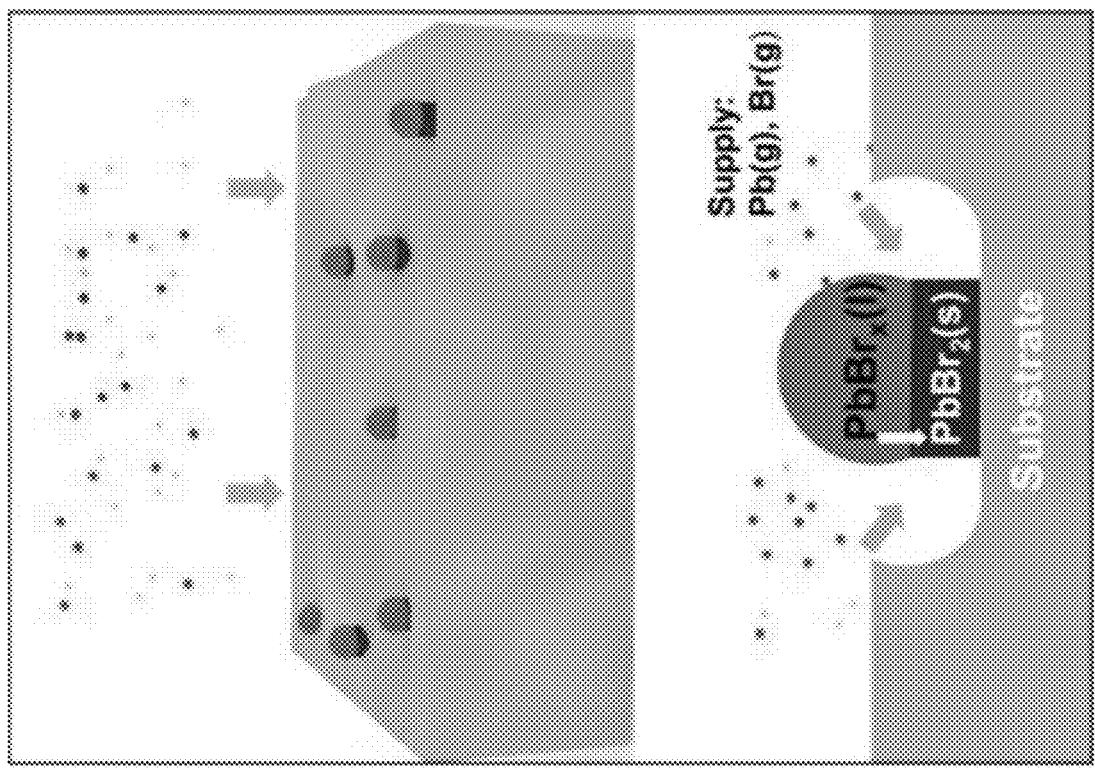
FIG. 16B is a schematic diagram of different growth stages of CsPbBr$_3$ NWs, illustrating the stage of growth of PbBr$_2$ NW seeds.
Figure 16C:
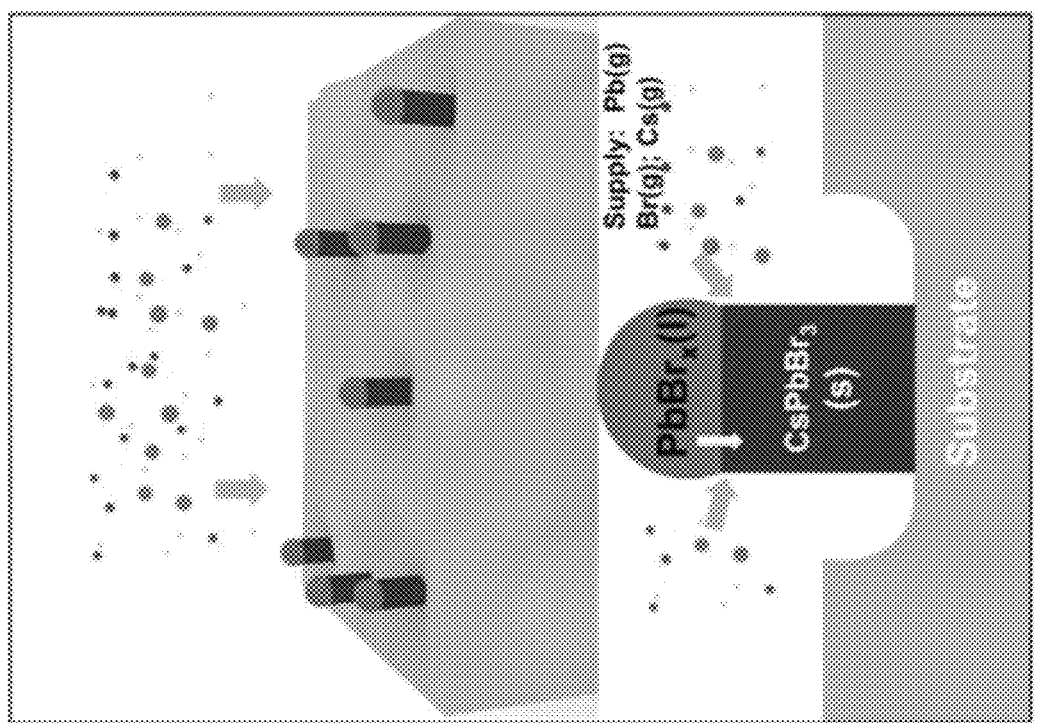
FIG. 16C is a schematic diagram of different growth stages of CsPbBr$_3$ NWs, illustrating the stage of growth of CsPbBr$_3$ NWs.
Figure 16D:
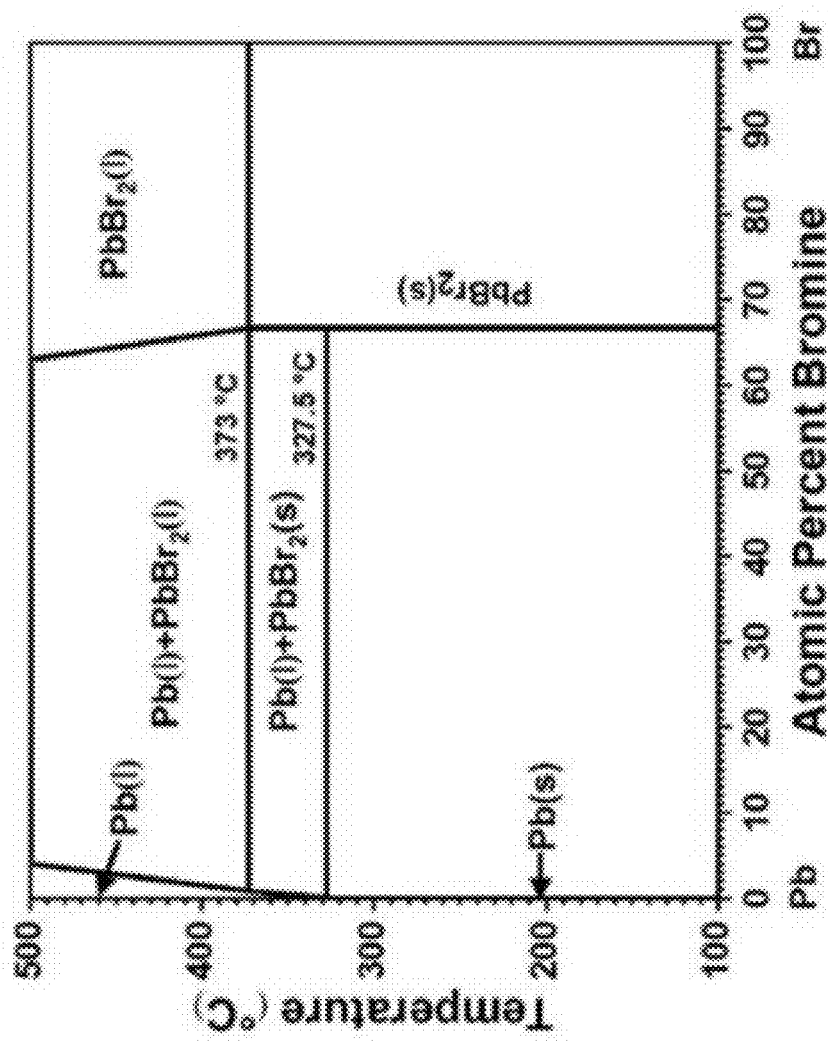
FIG. 16D is a phase diagram of the Pb—Br alloy.

Because Pb has a relatively low melting point, (327.4° C.), Pb species would get deposited onto the substrate as liquid droplets (FIG. 16A). The liquid droplets act as active sites for the catalytic nucleation of NWs. According to the phase diagram of PbBr$_2$ (FIG. 16D), the droplet would gradually become supersaturated with the continuous absorption of Br$_2$. Therefore, the alloyed droplets function as intermediate catalysts to nucleate and form the PbBr$_x$ solid seeds (FIG. 16B). When the source temperature increases, CsBr starts to evaporate and flow into the substrate zone with the assistance of argon carrier gas. Once the PbBr$_x$ droplets become activated, the Cs-containing species would be adsorbed onto the surface of the droplets and react with PbBr$_x$ seeds. As the perovskite CsPbBr$_3$ structure has a relatively low formation energy and stable crystal structure, the supersaturated CsPbBr$_3$ NWs are eventually grown in the vertical manner (FIG. 16C).

Example 3A

Photodetector Prepared from CsPbBr$_3$ Perovskite NWs

Figure 17:
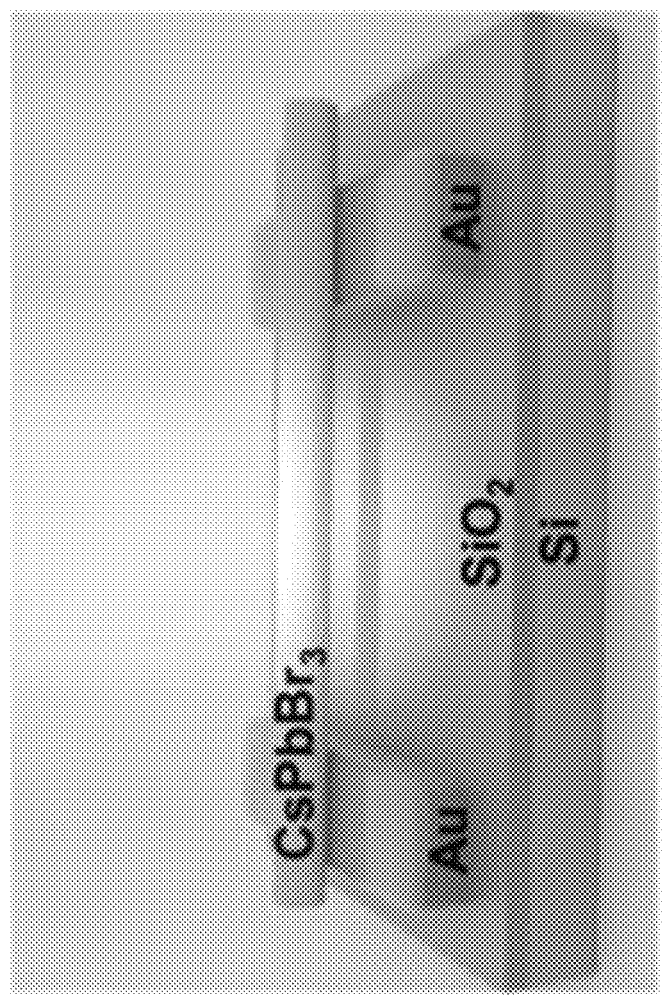
FIG. 17 is a schematic diagram illustrating the photodetector based on a single CsPbBr$_3$ NW prepared in accordance with an embodiment of the present invention.

In order to study the photoelectric performance of self-catalyzed NWs, a single self-catalyzed CsPbBr$_3$ NWs photodetector device was fabricated through the dry-transfer method (FIG. 17). Briefly, Au electrodes with a thickness of 50 nm and a channel length of 2 µm were prefabricated by standard (photo)lithography and metallization on SiO$_2$/Si substrates, followed by dry-transferring the CsPbBr$_3$ NW onto the Au electrodes for device integration.

Figure 18A:
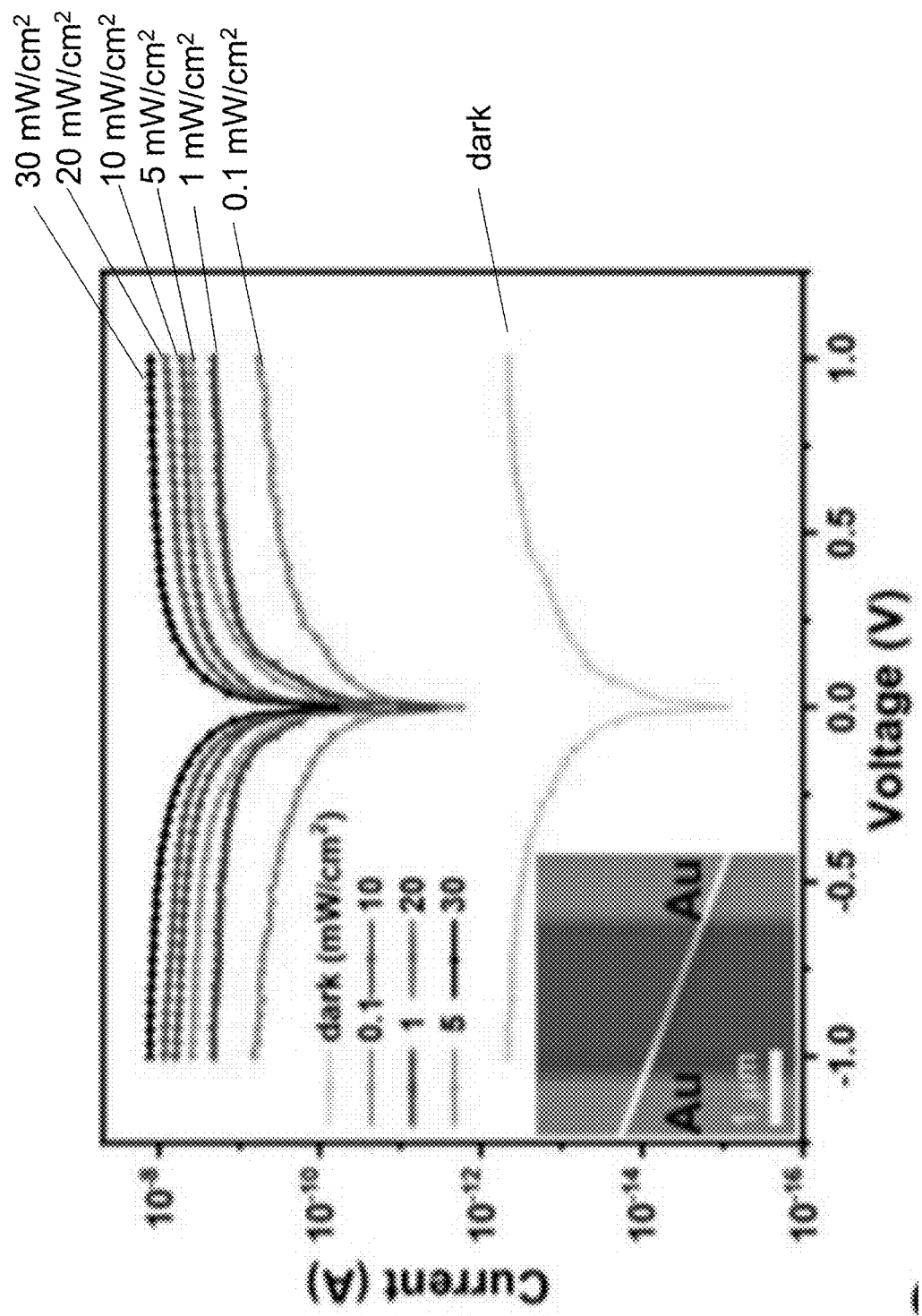
FIG. 18A is a plot of current against voltage showing the I-V curves of the photodetector with or without light irradiation. The insert is an SEM image showing the photodetector.

The current-voltage (I-V) curves of the device measured in the dark and under illumination of a light source at 450 nm with different light intensities (0.1-30 mW cm$^{-2}$) are shown in FIG. 18A. It is seen that the single NW device has a dark current down to fA level (in particular down to about 100 fA or below). As used herein, the phrase "below" means that the dark current may have a value greater than 100 fA, such as about 101 fA, about 105 fA, about 110 fA, etc. as long as it is within the fA level/scale. Meanwhile, under 0.1 mW cm$^{-2}$ illumination, the output current increases by about 4 orders of magnitude to above 10 nA. It can also be observed that the photocurrent is proportional to the drain voltage and illumination intensity. The symmetrical shape of the curve confirms that there is not significant resistance between the Au electrode and NW, indicating a good electrical contact therebetween for carrier collection.

Figure 18B:
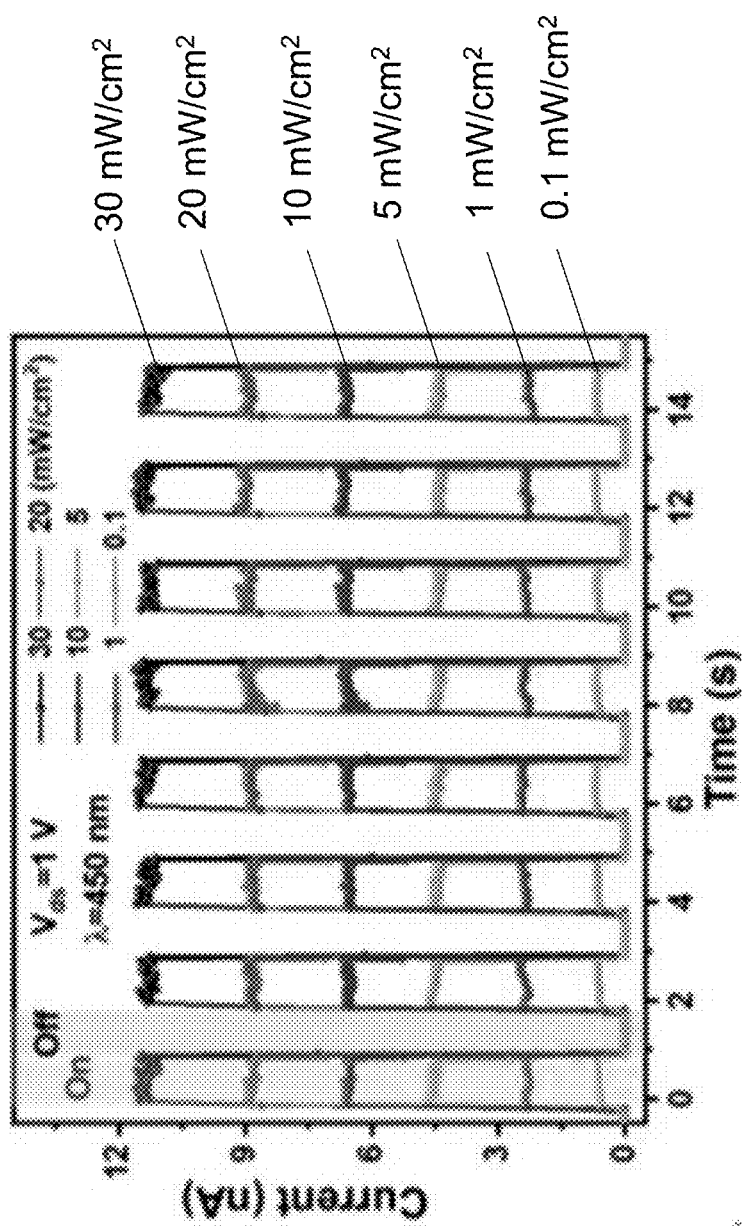
FIG. 18B is a plot of current against time showing time-resolved photoresponse of the photodetector under different light illumination density, with drain voltage being 1 V.
Figure 19A:
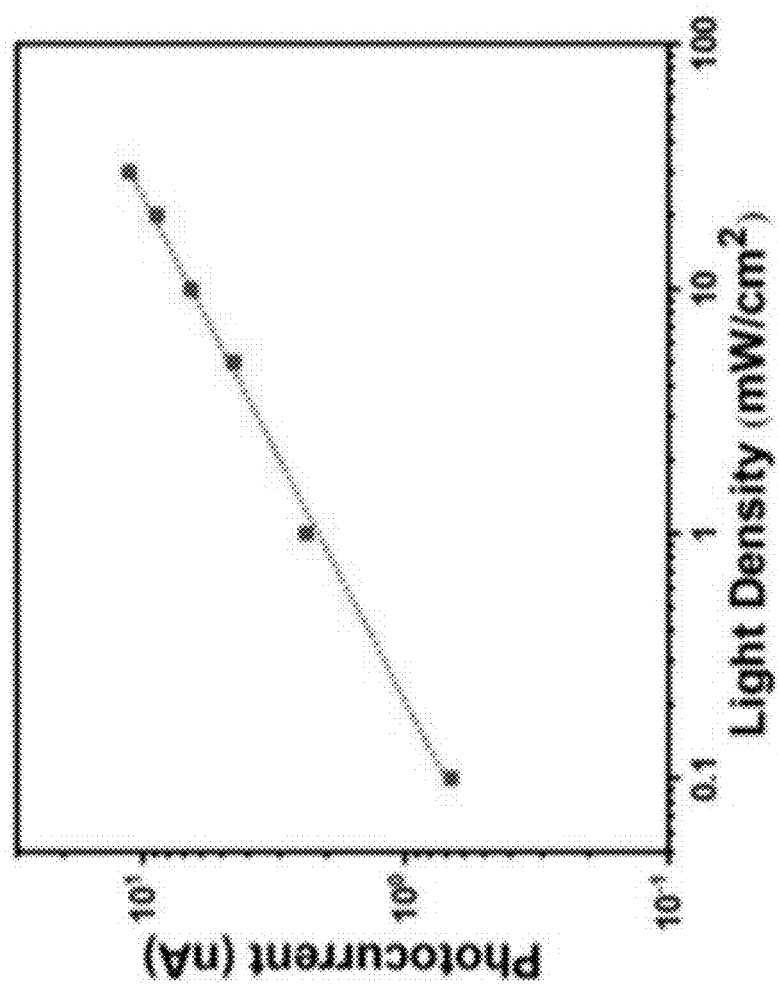
FIG. 19A is a plot of photocurrent against light density of the photodetector.

More importantly, all fabricated photodetector devices based on self-catalyzed CsPbBr$_3$ NWs exhibit good stability and reliability, as there is no noticeable degradation during repeated on/off switching cycles (FIG. 18B). Referring now to the photocurrent ($I_p = I_{light} - I_{dark}$) versus light intensity (P) plot (FIG. 19A), their relation is found to well satisfy the equation of $I_p = AP^k$, where A and k are the empirical parameters. The parameter k is estimated to be 0.5 through linear fitting. It is believed that this sublinear relationship is often observed in semiconductor NW-based photodetectors, which is owing to the complicated process of trap filling, energy band bending, carrier generation, trapping, and recombination. One of the most vital figures of merit for a photodetector is its photoresponsivity, R, which is defined as $$R = \frac{I_{light}}{PS}$$

where S is the actual illuminated area. Meanwhile, another important figures of merit parameter to quantify the performance of devices is detectivity (D*), which is defined as $$D^* \sqrt{\frac{S}{2eI_{dark}}}$$

where e is the electronic charge.

Figure 19B:
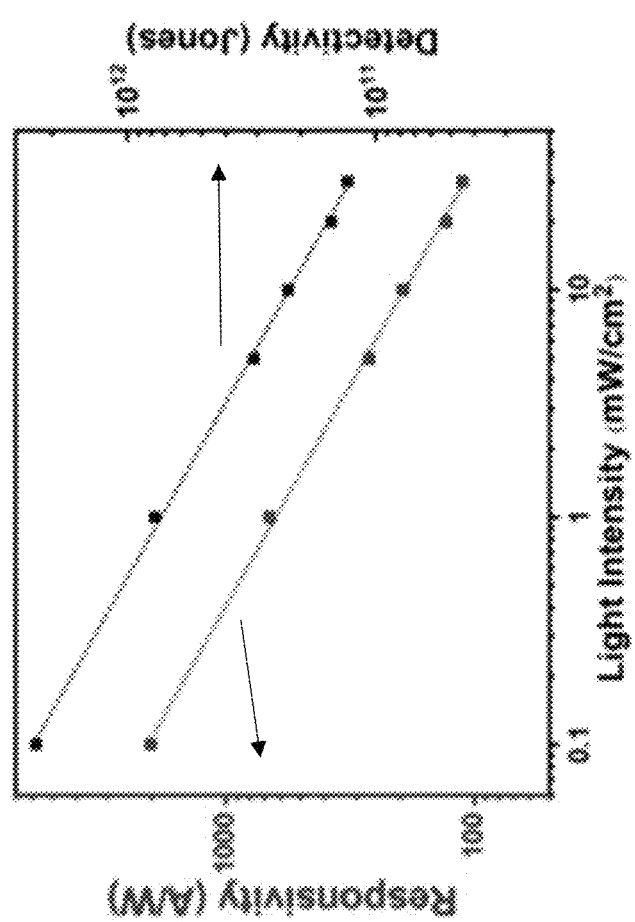
FIG. 19B is a plot of responsivity and detectivity against light density of the photodetector.

As shown in FIG. 19B, both R and D* decrease dramatically with the increasing light intensity. This reduction trend in photoresponsivity and detectivity may be explained in terms of the trap states existed either at the interface between CsPbBr$_3$ NW and underlying SiO$_2$ layer or within the NW. At a relatively low illumination intensity (0.1 mW cm$^{-2}$), the photodetector of the present invention reaches a high photoresponsivity of 2006 A W$^{-1}$ and a good detectivity of 2.57×10$^{12}$ Jones, being comparable to the state-of-the-art perovskite NW based photo detectors.

Figure 20:
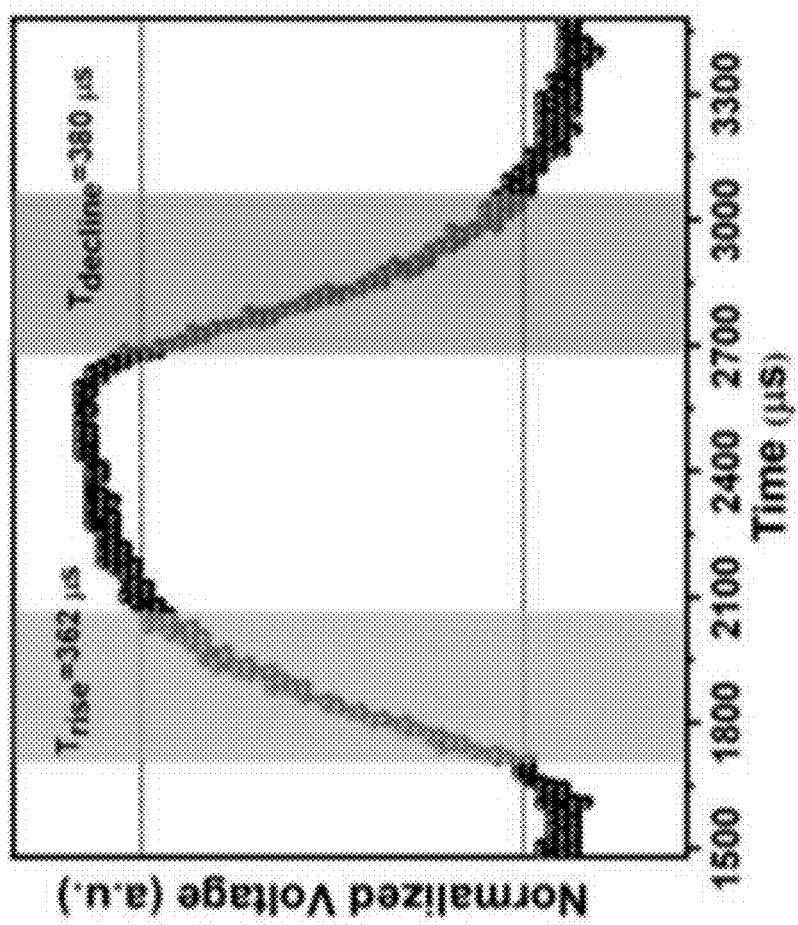
FIG. 20 is a plot of normalized voltage against time showing the rise and decay times of the photodetector.
Figure 21A:
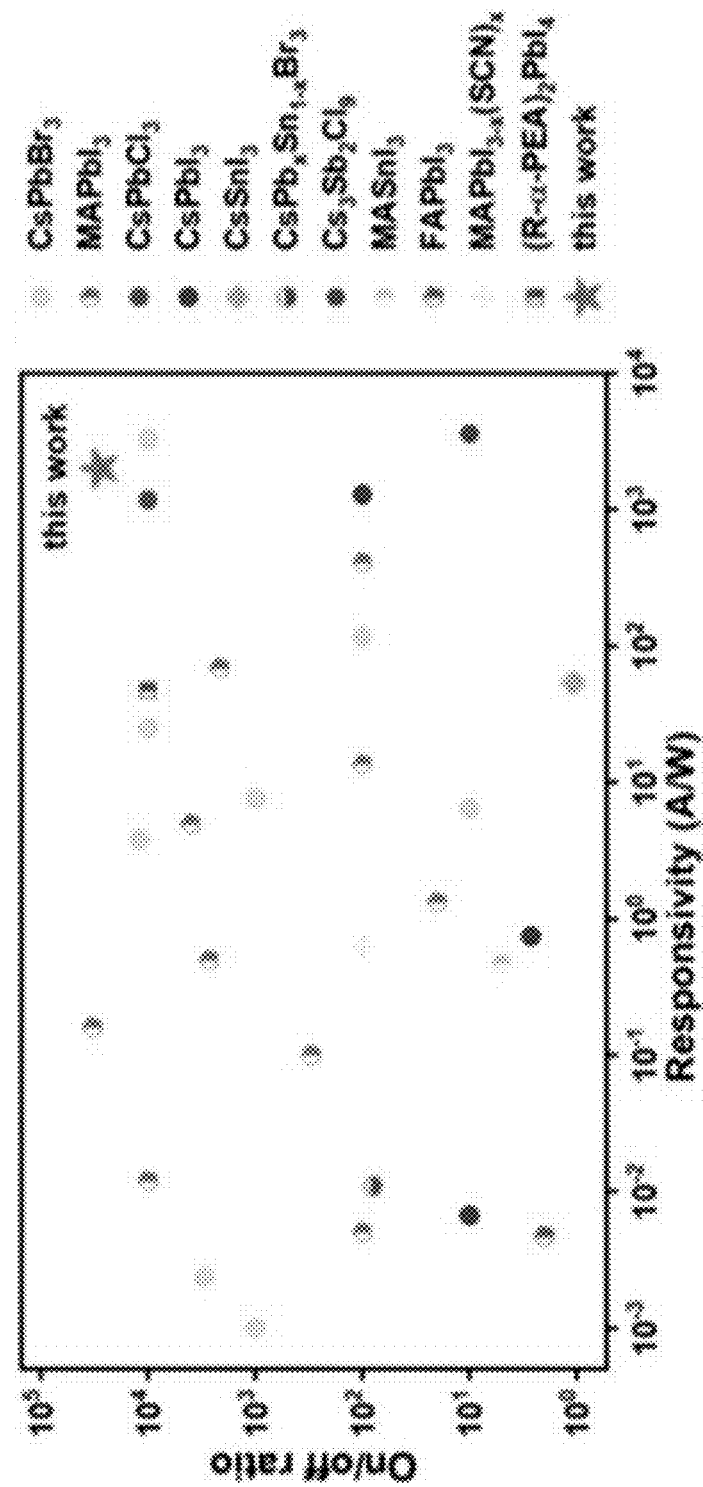
FIG. 21A is a plot of on/off ratio against responsivity of the self-catalyzed CsPbBr$_3$ of the present invention and other reported perovskite NWs.

In order to precisely measure the response time, a high frequency chopper was adopted to modulate the on and off states of illumination, and a digital oscilloscope was utilized to record the high-resolution photoresponse. As shown in FIG. 20, the rise (green area) and decay (red area) times, defined as the time for the photocurrent to vary from 10% to 90% of the peak current and from 90% to 10% of the peak current, are measured to be 362 μs and 380 μs, respectively. The detailed performance comparison among light/dark current ratio and responsivity of the reported perovskite NWs-based photodetectors and the self-catalyzed CsPbBr$_3$ NWs-based photodetector of the present invention is shown in FIGS. 21A to 21C, which suggest the excellent photodetection performance of the self-catalyzed CsPbBr$_3$ NWs of the present invention.

Example 3B

Phototransistor Prepared from CsPbBr$_3$ Perovskite NWs

Figure 22B:
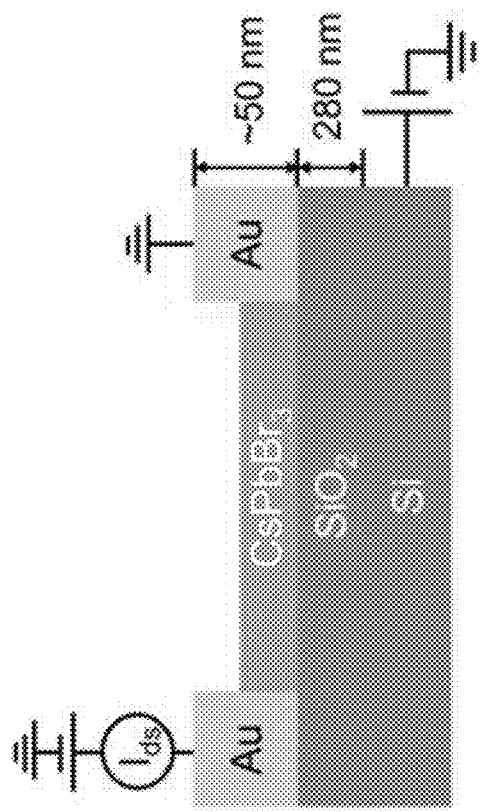
FIG. 22B is schematic diagram illustrating the cross-sectional view of the structure of the single CsPbBr$_3$ NW phototransistor of FIG. 22A, with the electrical connections used for device characterization.
Figure 22A:
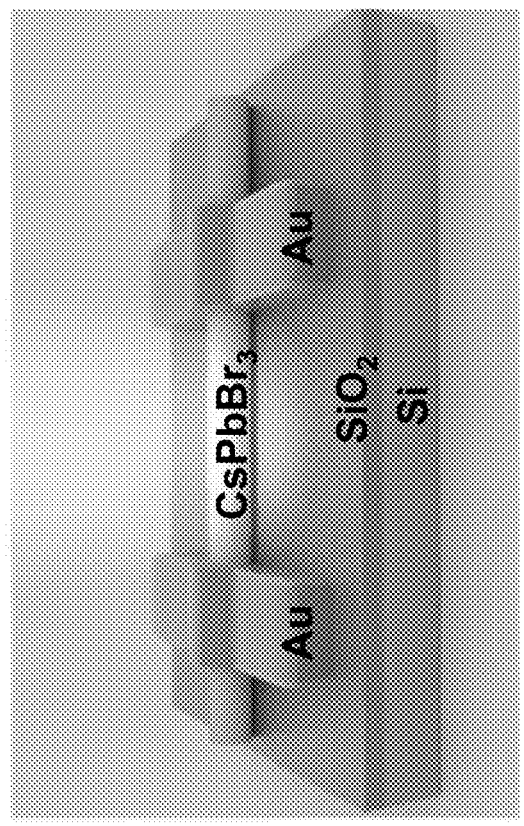
FIG. 22A is a schematic diagram illustrating a bottom gate-top contact phototransistor based on a single CsPbBr$_3$ NW prepared in accordance with an embodiment of the present invention.
Figure 23:
FIG. 23 is a SEM image showing the dry-transferred self-catalyzed CsPbBr$_3$ NWs.

A phototransistor based on a single CsPbBr$_3$ NW with a bottom-gate top-contact structure was fabricated (FIGS. 22A and 22B) and its photoelectronic properties were studied. Briefly, the degenerately p-doped Si is employed as a bottom gate while the 280 nm thick thermal oxide is used as the dielectric layer. After the CsPbBr$_3$ NW is dry-transferred onto the SiO$_2$/Si substrate (the dry-transfer result is shown in FIG. 23), a shadow mask is adopted to deposit the patterned Au electrode. The channel length is designed as 20 μm and the evaporated Au electrode is about 50 nm thick. For comparison studies, a similar phototransistor with a bottom-contact top-gate structure was also fabricated.

Figure 24A:
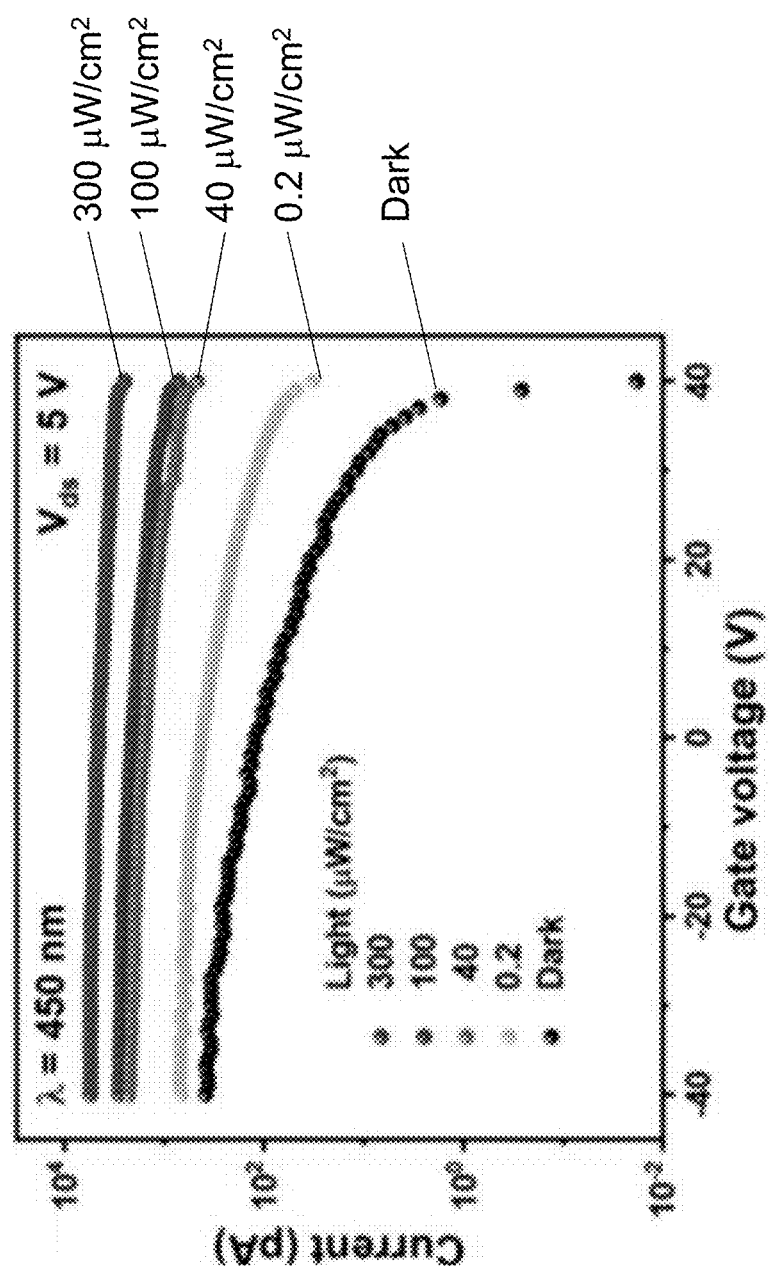
FIG. 24A is a plot of current against gate voltage showing the transfer characteristics of the CsPbBr$_3$ single NW FETs with and without light illumination.
Figure 24B:
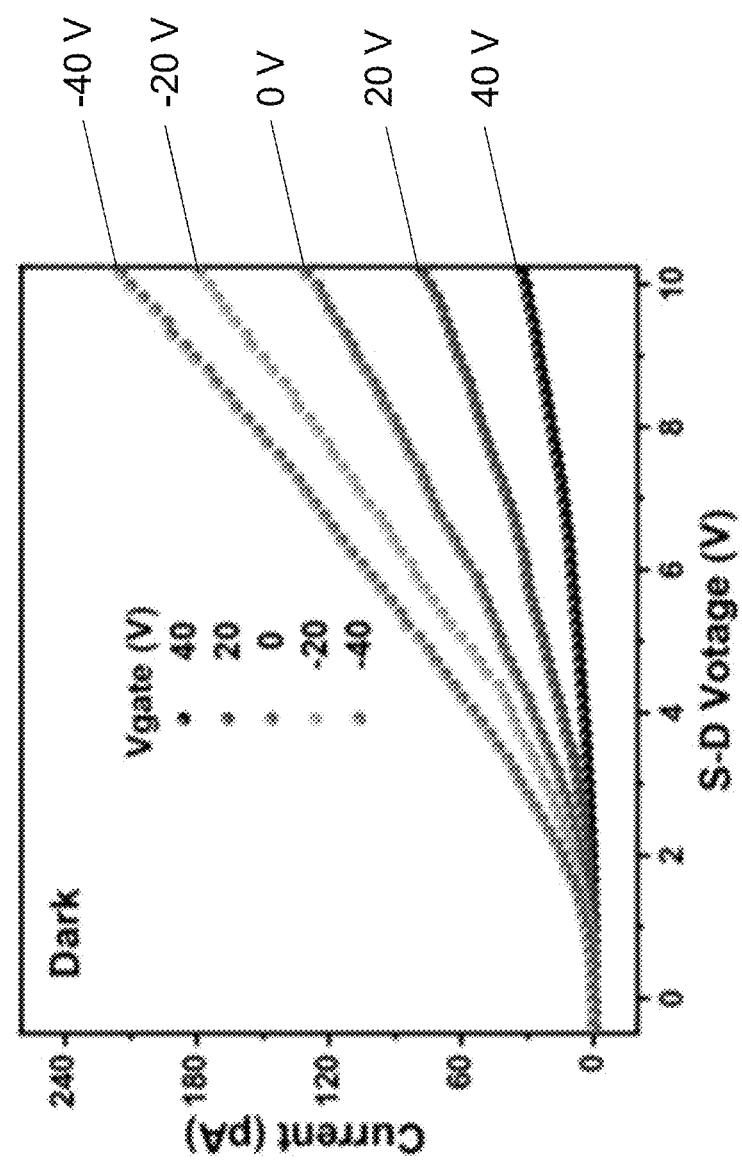
FIG. 24B is a plot of current against source-drain voltage showing the output curves of the CsPbBr$_3$ single NW FETs corresponding to the dark condition in FIG. 24A.
Figure 24C:
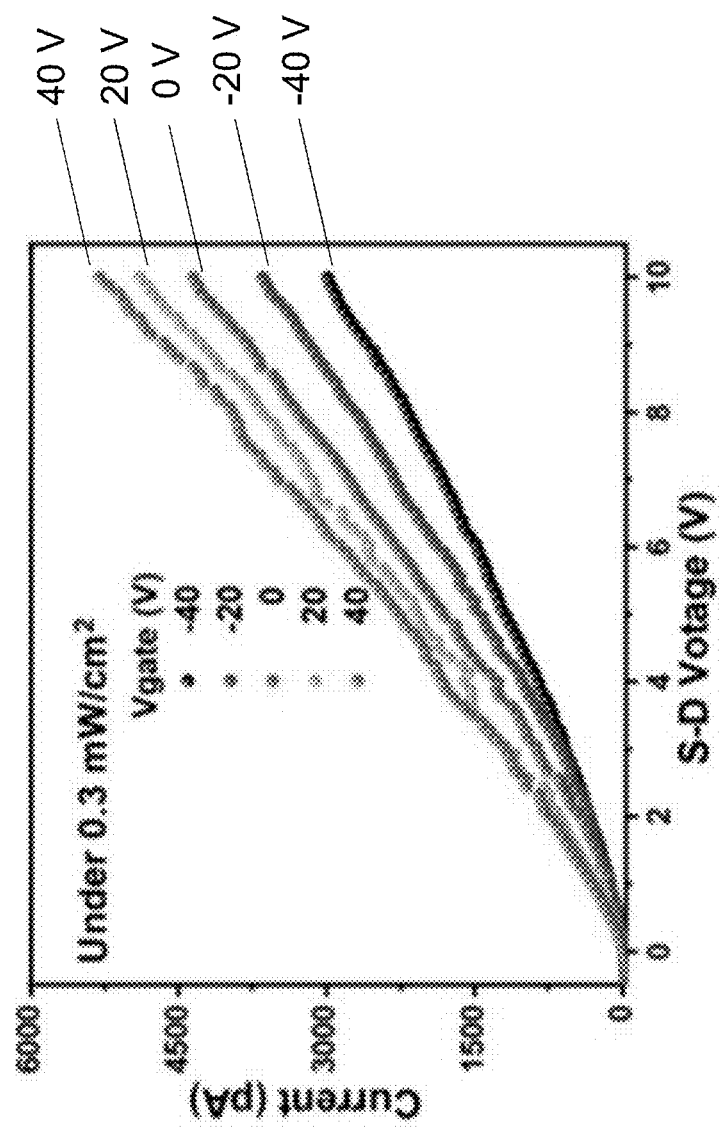
FIG. 24C is a plot of current against source-drain voltage showing the output curves of the CsPbBr$_3$ single NW FETs corresponding to the 0.3 mW cm$^{-2}$ illumination in FIG. 24A.
Figure 25A:
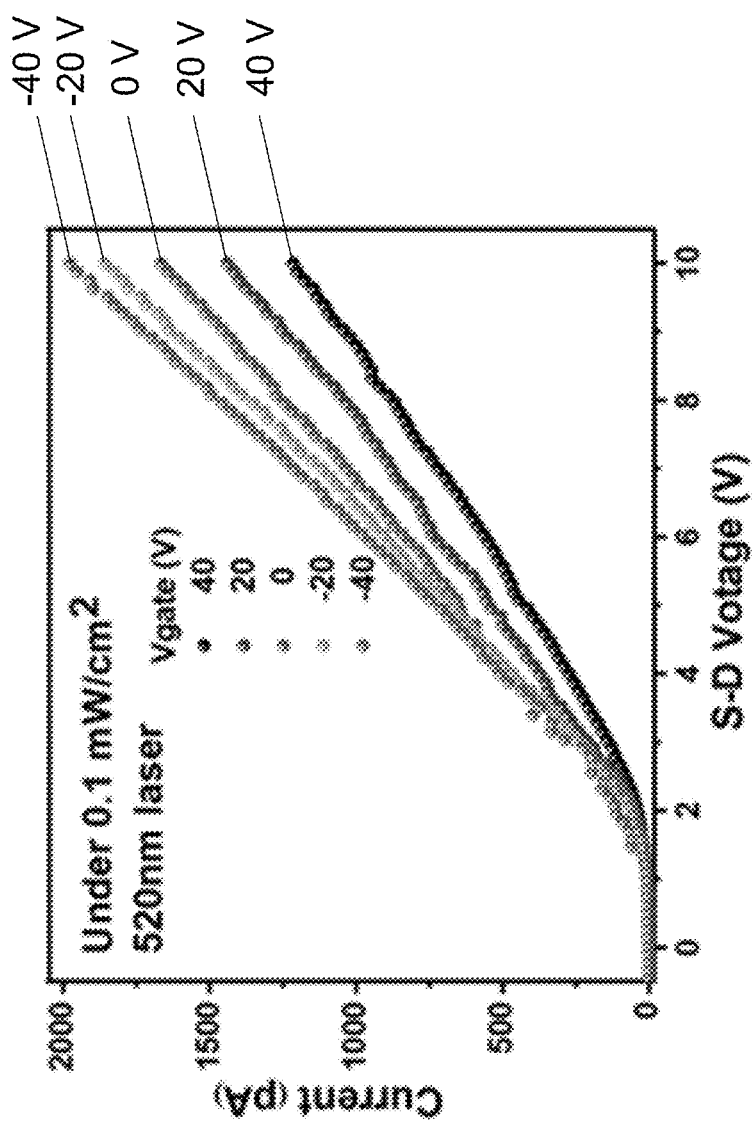
FIG. 25A is a plot of current against source-drain voltage showing the output curves of the CsPbBr$_3$ single NW FETs under 0.1 mW cm$^{-2}$ illumination with a 520 nm laser.
Figure 25B:
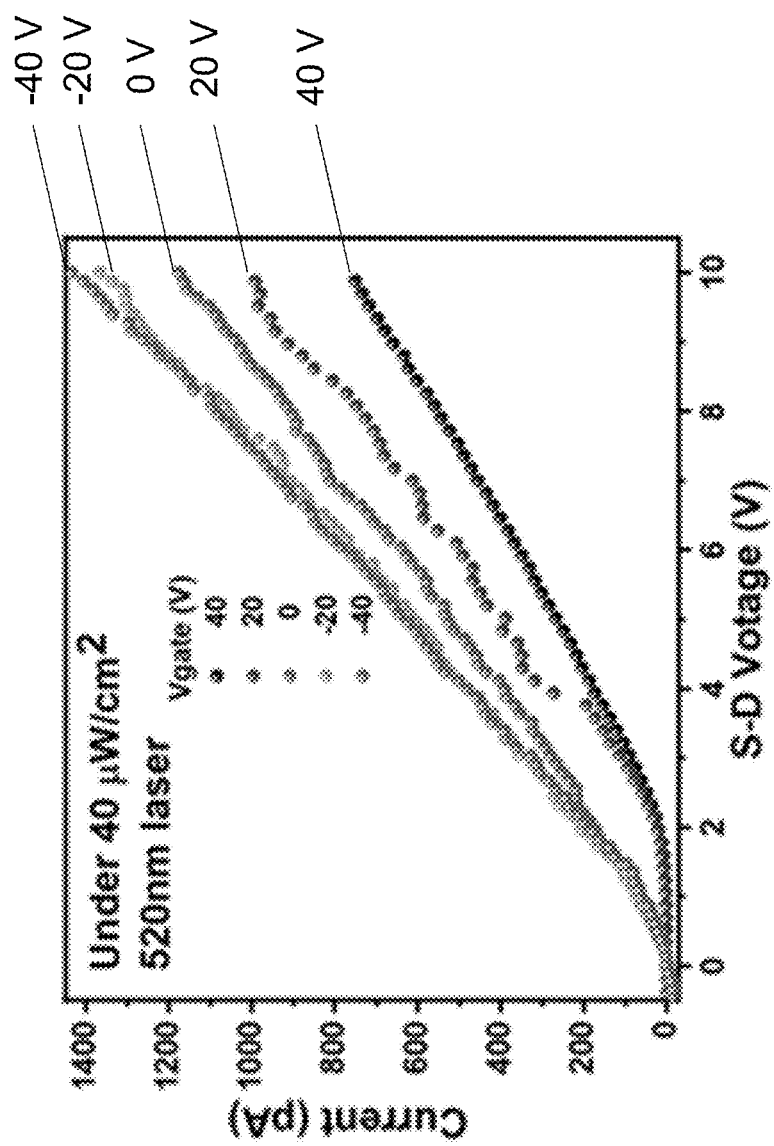
FIG. 25B is a plot of current against source-drain voltage showing the output curves of the CsPbBr$_3$ single NW FETs under 40 µW cm$^{-2}$ illumination with a 520 nm laser.
Figure 25C:
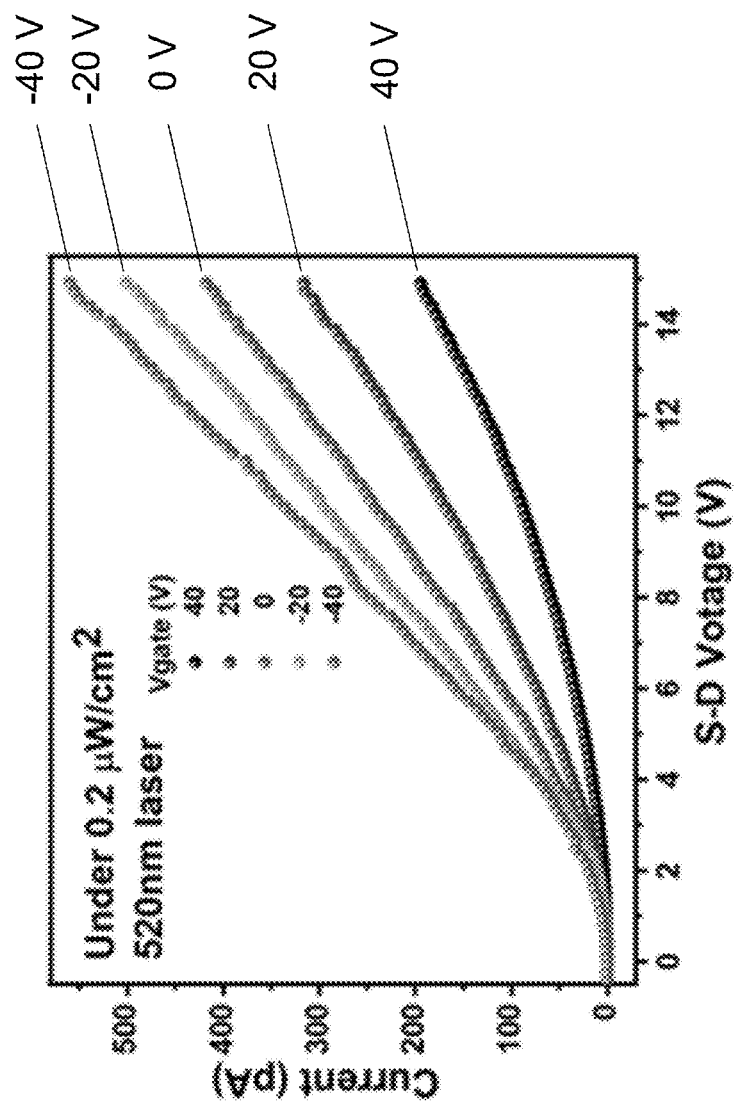
FIG. 25C is a plot of current against source-drain voltage showing the output curves of the CsPbBr$_3$ single NW FETs under 0.2 µW cm$^{-2}$ illumination with a 520 nm laser.

As shown in FIG. 24A, the phototransistor (with bottom-gate top-contact structure) shows a typical p-type semiconducting behavior with a field-effect hole mobility estimated to be about 0.05 cm$^2$ V$^{-1}$ s$^{-1}$. The transfer curves with a constant drain voltage of 5V and gate voltages switching from 40V to −40V in both dark and illumination conditions were recorded. As shown in FIGS. 24B and 24C, without illumination, the CsPbBr$_3$ NW phototransistor exhibited an on/off current ratio of 10+, while the irradiation can effectively elevate the source-drain current under the same gate bias (FIGS. 24B and 24C). Output characteristics of the phototransistor under other illumination conditions are shown in FIGS. 25A to 25C. Besides, the transistor performance of the top-contact (20 μm channel length) and bottom-contact (2 μm channel length) phototransistors is compared and the results are shown in FIGS. 26A and 26B. As shown, a shorter channel length could offer the phototransistor a higher light current and responsivity than a longer channel could, as a result of the larger transverse electric field and smaller transit time. However, it is noteworthy that in the bottom-contact device, the CsPbBr$_3$ nanowires cannot contact tightly with the SiO$_2$ dielectric layer, which leads to weak gate regulation and thus poor transistor performance. Accordingly, in this work, a top-contact transistors was fabricated in order to accurately characterize the carrier transport property of CsPbBr$_3$ nanowires.

Alternatively, it is believed that the performance of the photoelectronic devices of the present invention may be improved or optimized by introducing dopants into the CsPbBr$_3$ NWs, such as by way of controllable foreign atom doping and charge transfer doping techniques and the like.

It should be understood that the above only illustrates and describes examples whereby the present invention may be carried out, and that modifications and/or alterations may be made thereto without departing from the spirit of the invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable subcombination.

All references specifically cited herein are hereby incorporated by reference in their entireties. However, the citation or incorporation of such a reference is not necessarily an admission as to its appropriateness, citability, and/or availability as prior art to/against the present invention.

What is claimed is:

1. A method of fabricating a halide perovskite having a general formula of ABX$_3$, wherein A, B, and X are inorganic elements and X is a halide, the method comprising a vapor-liquid-solid process triggered by a catalyst formed from a halide precursor of inorganic element B.

2. The method as claimed in claim 1, wherein A is Cs and B is selected from Pb, Sn, In, or Tl; optionally, A is Cs and B is Pb.

3. The method as claimed in claim 2, wherein the vapor-liquid-solid process is enabled by a one-step autocatalytic nucleation process.

4. The method as claimed in claim 2, wherein the catalyst is formed from a vapor-source Pb source and the catalyst is in the form of a Pb liquid droplet; optionally, the catalyst is transformed into a $PbX_2$ alloying catalyst.

5. The method as claimed in claim 4, further comprising the step of preparing the catalyst by depositing the vapor-source Pb source onto a roughened growth substrate; optionally, the roughened growth substrate is a roughened $SiO_2$/Si growth substrate with a root-mean-square roughness of about 85 nm.

6. The method as claimed in claim 5, further comprising the step of preparing the roughened growth substrate with an abrasive of about 400 mesh to about 1200 mesh.

7. The method as claimed in claim 5, further comprising the steps of mixing the halide precursors $PbX_2$ and CsX with a molar ratio of about 2:1 and heating the halide precursor mixture in a first heating zone to serve as a vapor-phase Cs, Pb, and X source.

8. The method as claimed in claim 7, further comprising the step of annealing the halide precursor mixture to suppress evaporation process of the mixture prior heating in the first heating zone.

9. The method as claimed in claim 7, wherein the heating temperature of the first heating zone is about 400° C. to about 500° C.; optionally, the heating temperature of the first heating zone is about 480° C.

10. The method as claimed in claim 7, further comprising the steps of placing the roughened growth substrate into a second heating zone, and heating the roughened growth substrate at a growth temperature of about 250° C. to about 350° C. to allow the vapor-source Pb source to deposit on the roughened growth substrate to form the Pb liquid droplet, and convert to the $PbX_2$ alloying catalyst for further reacting with the vapor-phase Cs, Pb and X source; optionally, X is selected from Cl, Br and I.

11. The method as claimed in claim 10, wherein the second heating zone has a growth temperature of about 330° C.

12. The method as claimed in claim 10, wherein the second heating zone has a growth pressure of about 1.5 Torr.

13. The method as claimed in claim 10, wherein the second heating zone includes a carrier gas flow comprises Ar at about 100 sccm.

14. The method as claimed in claim 10, wherein the roughened growth substrate is placed in the second heating zone at a distance of about 10 cm to about 20 cm away from the halide precursor mixture; optionally, the roughened growth substrate is placed in the second heating zone at a distance of about 15 cm away from the halide precursor mixture.

15. The method as claimed in claim 10, wherein the step takes about 70 mins for the growth of $CsPbX_3$ nanowire on the roughened growth substrate.

16. The method as claimed in claim 15, wherein the $CsPbX_3$ nanowire grows along a crystal plane with a lower surface free energy than other crystal planes, via a super-saturation process; optionally, the $CsPbX_3$ nanowire grows along the (100) plane of the $CsPbX_3$ nanowire.

17. The method as claimed in claim 16, wherein the $CsPbX_3$ nanowire is selected from a group comprising $CsPbI_3$, $CsPbCl_3$, and $CsPbBr_3$ nanowires.

18. A $ABX_3$ nanowire formed by the method as claimed in claim 1, wherein the $ABX_3$ nanowire is vertically formed on a roughened growth substrate, where A is Cs, B is Pb and X is a halide; optionally, X is selected from Cl, Br and I.

19. The $ABX_3$ nanowire as claimed in claim 18, wherein the $ABX_3$ nanowire is terminated with a spherical catalytic tip.

20. The $ABX_3$ nanowire as claimed in claim 18, wherein when B is Pb and X is Br, resulting $CsPbBr_3$ nanowire comprises a monoclinic crystalline phase.

21. The $ABX_3$ nanowire as claimed in claim 20, wherein the $CsPbBr_3$ nanowire emits green light across its entire length.

22. The $ABX_3$ nanowire as claimed in claim 19, wherein the spherical catalytic tip comprises a Pb—Br seed; optionally, the Pb—Br seed comprises a $PbBr_2$ alloying catalyst.

23. The $ABX_3$ nanowire as claimed in claim 20, wherein the $CsPbBr_3$ nanowire is about 5 μm to about 15 μm in length and about 110 nm to about 120 nm in diameter.

24. A photoelectronic device comprising the $ABX_3$ nanowire as claimed in claim 18.

25. The photoelectronic device as claimed in claim 24, comprising a visible light photodetector and a phototransistor.

26. The photoelectronic device as claimed in claim 25, wherein when the photoelectronic device is the visible light photodetector, the $ABX_3$ nanowire is dry transferred onto a Au electrode.

27. The photoelectronic device as claimed in claim 25, wherein when the photoelectronic device is the visible light photodetector, the Au electrode is fabricated with a 2 μm channel length and is fabricated on a $SiO_2$/Si substrate.

28. The photoelectronic device as claimed in claim 25, wherein the phototransistor comprises a bottom-gate top contact structure.

29. The photoelectronic device as claimed in claim 28, wherein when the phototransistor has a bottom-gate top contact structure, the $ABX_3$ nanowire is dry transferred onto a $SiO_2$/Si substrate.

30. The photoelectronic device as claimed in claim 28, wherein when the phototransistor has a bottom-gate top contact structure, a Au electrode is fabricated with a 20 μm channel length and is fabricated onto the $SiO_2$/Si substrate.

31. The photoelectronic device as claimed in claim 26, wherein when the $ABX_3$ nanowire is a $CsPbX_3$ nanowire, the visible light photodetector has a dark current of about 100 fA or below.

32. The photoelectronic device as claimed in claim 26, wherein when the $ABX_3$ nanowire is a $CsPbX_3$ nanowire, the visible light photodetector has a light current of about 10 nA with an incident light intensity of about 0.1 mW cm$^{-2}$.

33. The photoelectronic device as claimed in claim 26, wherein when the $ABX_3$ nanowire is a $CsPbX_3$ nanowire, the visible light photodetector has a specific detectivity of about $2.57 \times 10^{12}$ Jones.

34. The photoelectronic device as claimed in claim 26, wherein when the $ABX_3$ nanowire is a $CsPbX_3$ nanowire, the visible light photodetector has a responsivity of about 2006 A W$^{-1}$ with an incident light intensity of about 0.1 mW cm$^{-2}$.

35. The photoelectronic device as claimed in claim 26, wherein when the $ABX_3$ nanowire is a $CsPbX_3$ nanowire, the visible light photodetector has a photoresponse time from about 362 μs to about 380 μs.

36. The photoelectronic device as claimed in claim 29, wherein when the $ABX_3$ is a $CsPbX_3$ nanowire, the phototransistor has a field-effect hole mobility of about 0.05 cm$^2$ V$^{-1}$ s$^{-1}$.

* * * * *